United States Patent
Evans et al.

(10) Patent No.: US 9,490,405 B2
(45) Date of Patent: *Nov. 8, 2016

(54) LIGHT EMITTING DIODE DEVICE AND METHOD FOR PRODUCTION THEREOF CONTAINING CONVERSION MATERIAL CHEMISTRY

(71) Applicant: SABIC Global Technologies, B.V., Bergen op Zoom (NL)

(72) Inventors: Thomas L. Evans, Mt. Vernon, IN (US); Christopher Luke Hein, Evansville, IN (US)

(73) Assignee: SABIC INNOVATIVE PLASTICS IP B.V. (NL)

( * ) Notice: Subject to any disclaimer, the term of this patent is extended or adjusted under 35 U.S.C. 154(b) by 39 days.

This patent is subject to a terminal disclaimer.

(21) Appl. No.: 13/757,207

(22) Filed: Feb. 1, 2013

(65) Prior Publication Data

US 2013/0200415 A1    Aug. 8, 2013

Related U.S. Application Data

(60) Provisional application No. 61/594,813, filed on Feb. 3, 2012.

(51) Int. Cl.
*H01L 33/56* (2010.01)
*H01L 33/50* (2010.01)

(52) U.S. Cl.
CPC .............. *H01L 33/56* (2013.01); *H01L 33/507* (2013.01)

(58) Field of Classification Search
CPC ....... H01L 33/00; H01L 33/50; H01L 33/56; H01L 33/501; H01L 33/502; H01L 23/293; H01L 33/507
See application file for complete search history.

(56) References Cited

U.S. PATENT DOCUMENTS

| | | |
|---|---|---|
| 489,803 A | 1/1893 | Gillespie et al. |
| 3,049,568 A | 8/1962 | Apel et al. |
| 3,394,089 A | 7/1968 | McNutt et al. |
| 3,673,262 A | 6/1972 | Prahl et al. |
| 3,839,247 A | 10/1974 | Bialous et al. |
| 4,045,379 A | 8/1977 | Kwantes et al. |
| 4,052,466 A | 10/1977 | Sun |
| 4,076,686 A | 2/1978 | Calkins |
| 4,191,843 A | 3/1980 | Kwantes et al. |
| 4,294,995 A | 10/1981 | Faler et al. |
| 4,308,404 A | 12/1981 | Kwantes et al. |
| 4,308,405 A | 12/1981 | Kwantes |
| 4,346,247 A | 8/1982 | Faler et al. |
| 4,365,099 A | 12/1982 | Faler et al. |
| 4,391,997 A | 7/1983 | Mendiratta |
| 4,396,728 A | 8/1983 | Faler |
| 4,400,555 A | 8/1983 | Mendiratta |
| 4,423,252 A | 12/1983 | Maki et al. |
| 4,424,283 A | 1/1984 | Faler et al. |
| 4,455,409 A | 6/1984 | Faler et al. |
| 4,478,956 A | 10/1984 | Maki et al. |
| 4,584,416 A | 4/1986 | Pressman et al. |
| 4,590,303 A | 5/1986 | Mendiratta |
| 4,595,704 A | 6/1986 | Fazio |
| 4,819,245 A | 4/1989 | Morimoto et al. |
| 4,820,740 A | 4/1989 | Li |
| 4,822,923 A | 4/1989 | Li |
| 4,918,245 A | 4/1990 | Iimuro et al. |
| 5,015,784 A | 5/1991 | Rudolph et al. |
| 5,064,885 A | 11/1991 | Muller et al. |
| 5,087,767 A | 2/1992 | Okamoto et al. |
| 5,212,206 A | 5/1993 | Rudolph et al. |
| 5,233,096 A | 8/1993 | Lundquist |
| 5,284,981 A | 2/1994 | Rudolph et al. |
| 5,288,926 A | 2/1994 | Patrascu et al. |
| 5,302,774 A | 4/1994 | Berg et al. |
| 5,364,895 A | 11/1994 | Stevenson et al. |
| 5,395,857 A | 3/1995 | Berg et al. |
| 5,414,151 A | 5/1995 | Pressman et al. |
| 5,414,152 A | 5/1995 | Cipullo |
| 5,424,006 A | 6/1995 | Murayama et al. |
| 5,438,086 A | 8/1995 | Stevenson et al. |
| 5,455,282 A | 10/1995 | Berg et al. |
| 5,463,140 A | 10/1995 | Wehmeyer et al. |

(Continued)

FOREIGN PATENT DOCUMENTS

| | | |
|---|---|---|
| CN | 101205358 A | 6/2008 |
| CN | 101885907 A | 11/2010 |

(Continued)

OTHER PUBLICATIONS

Chinese Patent No. 101205358 (A); Publication Date: Jun. 25, 2008; Abstract Only; 1 Page.

(Continued)

*Primary Examiner* — Fazli Erdem
(74) *Attorney, Agent, or Firm* — Cantor Colburn LLP

(57) ABSTRACT

In one embodiment, a light emitting device comprises: a lighting element located in a housing, wherein the housing is formed from a polymer composition comprising: a polymer material; and a coated conversion material. The coated conversion material is selected from a coated conversion material, coated yttrium aluminum garnet (YAG) doped with rare earth elements, coated terbium aluminum garnet doped with rare earth elements, coated silicate (BOSE) doped with rare earth elements; coated nitrido silicates doped with rare earth elements; coated nitride orthosilicate doped with rare earth elements, coated oxonitridoaluminosilicates doped with rare earth elements; as well as combinations comprising at least one of the foregoing. After the coated conversion material has been exposed to an excitation source, the coated conversion material has a luminescence lifetime of less than $10^{-4}$ seconds when the excitation source is removed.

69 Claims, 1 Drawing Sheet

(56) References Cited

U.S. PATENT DOCUMENTS

| | | | |
|---|---|---|---|
| 5,470,938 A | 11/1995 | Sakashita et al. | |
| 5,475,154 A | 12/1995 | Lundquist et al. | |
| 5,589,517 A | 12/1996 | Sugawara et al. | |
| 5,631,338 A | 5/1997 | Inoue et al. | |
| 5,672,664 A | 9/1997 | DeRudder et al. | |
| 5,698,600 A | 12/1997 | Wulff et al. | |
| 5,747,632 A | 5/1998 | Adachi et al. | |
| 5,780,690 A | 7/1998 | Berg et al. | |
| 5,783,733 A | 7/1998 | Kissinger | |
| 5,786,733 A | 7/1998 | Yamaguchi | |
| 5,883,218 A | 3/1999 | Gordon et al. | |
| 5,914,431 A | 6/1999 | Fennhoff | |
| 5,939,494 A | 8/1999 | Wehmeyer et al. | |
| 6,066,861 A | 5/2000 | Hohn et al. | |
| 6,069,225 A | 5/2000 | Gerace et al. | |
| 6,133,190 A | 10/2000 | Wehmeyer et al. | |
| 6,174,987 B1 | 1/2001 | Gordon et al. | |
| 6,211,417 B1 | 4/2001 | Fengler et al. | |
| 6,329,556 B1 | 12/2001 | Sakura et al. | |
| 6,373,262 B1 | 4/2002 | Herring et al. | |
| 6,414,199 B1 | 7/2002 | Saruwatari | |
| 6,429,343 B1 | 8/2002 | Iwahara | |
| 6,429,373 B1 | 8/2002 | Scrimpshire et al. | |
| 6,486,222 B2 | 11/2002 | Kissinger et al. | |
| 6,586,637 B2 | 7/2003 | Iwahara | |
| 6,613,823 B1 | 9/2003 | Battiste et al. | |
| 6,653,513 B1 | 11/2003 | Iwahara | |
| 6,653,613 B1 | 11/2003 | Bucourt et al. | |
| 6,676,852 B2 | 1/2004 | Brown et al. | |
| 6,692,659 B2 | 2/2004 | Brown et al. | |
| 6,706,846 B2 | 3/2004 | Brack et al. | |
| 6,710,211 B1 | 3/2004 | Heydenreich et al. | |
| 6,716,368 B1 | 4/2004 | Schottland et al. | |
| 6,727,394 B2 | 4/2004 | Saruwatari | |
| 6,730,816 B2 | 5/2004 | Lundquist | |
| 6,740,784 B2 | 5/2004 | Iwahara et al. | |
| 6,995,294 B2 | 2/2006 | Webb et al. | |
| 7,112,702 B2 | 9/2006 | Carvill et al. | |
| 7,112,703 B2 | 9/2006 | Neumann et al. | |
| 7,129,382 B2 | 10/2006 | Iwahara et al. | |
| 7,227,046 B2 | 6/2007 | Commarieu | |
| 7,491,837 B2 | 2/2009 | Schlosberg et al. | |
| 7,852,428 B2 | 12/2010 | Byoun et al. | |
| 7,879,927 B2 | 2/2011 | Vlottes et al. | |
| 7,923,586 B2 | 4/2011 | Stahlbush et al. | |
| 7,959,827 B2 | 6/2011 | Comanzo et al. | |
| 7,964,273 B2 | 6/2011 | Kogure et al. | |
| 7,989,531 B2 | 8/2011 | Bersted et al. | |
| 8,250,101 B2 | 8/2012 | Fot et al. | |
| 8,735,634 B2 | 5/2014 | Hasyagar et al. | |
| 2002/0147256 A1 | 10/2002 | Eckel et al. | |
| 2003/0180542 A1 | 9/2003 | Pickett et al. | |
| 2003/0232957 A1 | 12/2003 | Silvi et al. | |
| 2004/0077820 A1 | 4/2004 | Silva et al. | |
| 2004/0116751 A1 | 6/2004 | Carvill et al. | |
| 2004/0181100 A1 | 9/2004 | Lundquist | |
| 2004/0227465 A1 | 11/2004 | Menkara et al. | |
| 2005/0035331 A1 | 2/2005 | Sun | |
| 2005/0113534 A1 | 5/2005 | Agarwal et al. | |
| 2005/0177007 A1 | 8/2005 | Neumann et al. | |
| 2005/0215833 A1 | 9/2005 | Neumann et al. | |
| 2006/0135690 A1* | 6/2006 | Juikar et al. | 525/67 |
| 2006/0247356 A1 | 11/2006 | Agarwal | |
| 2006/0263547 A1 | 11/2006 | Cojocariu et al. | |
| 2007/0004941 A1 | 1/2007 | Blaschke et al. | |
| 2007/0139949 A1 | 6/2007 | Tanda et al. | |
| 2007/0299169 A1 | 12/2007 | Ohira et al. | |
| 2008/0029720 A1* | 2/2008 | Li | 250/581 |
| 2008/0081855 A1 | 4/2008 | Mullen | |
| 2008/0113117 A1 | 5/2008 | Coenjarts et al. | |
| 2009/0043053 A1 | 2/2009 | Gorney et al. | |
| 2009/0054586 A1 | 2/2009 | Hein et al. | |
| 2009/0278444 A1* | 11/2009 | Forrest et al. | 313/504 |
| 2010/0137549 A1 | 6/2010 | Takahashi et al. | |
| 2011/0127904 A1 | 6/2011 | Tsai | |
| 2011/0140593 A1 | 6/2011 | Negley et al. | |
| 2011/0151262 A1 | 6/2011 | Heuer et al. | |
| 2011/0278614 A1 | 11/2011 | Maier-Richter et al. | |
| 2012/0043552 A1 | 2/2012 | David et al. | |
| 2012/0126260 A1* | 5/2012 | Hussell et al. | 257/88 |
| 2012/0252985 A1 | 10/2012 | Rosenquist et al. | |
| 2012/0283485 A1 | 11/2012 | Hasyagar et al. | |
| 2013/0094179 A1 | 4/2013 | Dai et al. | |
| 2013/0108820 A1 | 5/2013 | Belfadhel et al. | |
| 2013/0221837 A1* | 8/2013 | de Brouwer | C08G 64/307 313/503 |
| 2013/0270591 A1* | 10/2013 | de Brouwer | H01L 23/293 257/98 |
| 2014/0051802 A1 | 2/2014 | De Brouwer et al. | |
| 2014/0051803 A1 | 2/2014 | De Brouwer et al. | |
| 2014/0117393 A1 | 5/2014 | Van Heerbeek et al. | |
| 2014/0226342 A1 | 8/2014 | Flores et al. | |
| 2014/0339586 A1* | 11/2014 | Morizur | G02B 1/04 257/98 |
| 2015/0318450 A1 | 11/2015 | De Brouwer et al. | |

FOREIGN PATENT DOCUMENTS

| | | |
|---|---|---|
| CN | 102134383 A | 7/2011 |
| CN | 202091807 U | 12/2011 |
| DE | 102006016548 A1 | 10/2006 |
| EP | 0320658 A1 | 6/1989 |
| EP | 0475893 A1 | 3/1992 |
| EP | 0313165 B1 | 1/1993 |
| EP | 0523931 A2 | 1/1993 |
| EP | 0693470 B1 | 5/1998 |
| EP | 0885929 A1 | 12/1998 |
| EP | 0676237 B1 | 3/1999 |
| EP | 1160229 A1 | 12/2001 |
| EP | 1201303 A1 | 5/2002 |
| EP | 1234845 A2 | 8/2002 |
| EP | 1273563 A1 | 1/2003 |
| EP | 0788839 B1 | 5/2003 |
| EP | 1371623 A1 | 12/2003 |
| EP | 1459805 A1 | 9/2004 |
| EP | 1500671 A1 | 1/2005 |
| EP | 1222960 B1 | 8/2005 |
| EP | 1808726 A1 | 7/2007 |
| EP | 1925874 A1 | 5/2008 |
| EP | 1520617 B1 | 2/2009 |
| EP | 2143750 A1 | 1/2010 |
| EP | 2248841 A1 | 11/2010 |
| FR | 2685221 A1 | 6/1993 |
| FR | 2685323 A1 | 6/1993 |
| GB | 1377227 A | 12/1974 |
| JP | 5271132 A | 10/1993 |
| JP | 5294875 A | 11/1993 |
| JP | 5294876 A | 11/1993 |
| JP | 8038910 A | 2/1996 |
| JP | 08071433 A | 3/1996 |
| JP | 08319248 A | 12/1996 |
| JP | 08325185 A | 12/1996 |
| JP | 10211434 A | 8/1998 |
| JP | 10251180 A | 9/1998 |
| JP | 10314595 A | 12/1998 |
| JP | 10328573 A | 12/1998 |
| JP | 11179210 A | 7/1999 |
| JP | 11246458 A | 9/1999 |
| JP | 11255748 A | 9/1999 |
| JP | 2000281607 A | 10/2000 |
| JP | 2000281608 A | 10/2000 |
| JP | 2000319216 A | 11/2000 |
| JP | 2001233812 A | 8/2001 |
| JP | 2004149623 A | 5/2004 |
| JP | 2004231935 A | 8/2004 |
| JP | 2005037591 A | 2/2005 |
| JP | 2005048154 A | 2/2005 |
| JP | 2005082713 A | 3/2005 |
| JP | 2005115051 A | 4/2005 |
| JP | 2006339033 A | 12/2006 |
| JP | 2008184482 A | 8/2008 |
| JP | 2011029051 A | 2/2011 |
| KR | 20110033772 A | 3/2011 |
| WO | 9209550 A1 | 6/1992 |

(56) References Cited

FOREIGN PATENT DOCUMENTS

| WO | 9708122 A1 | 3/1997 |
|---|---|---|
| WO | 0050372 A1 | 8/2000 |
| WO | 0059853 A1 | 10/2000 |
| WO | 2008100165 A1 | 8/2008 |
| WO | 2011082204 A1 | 7/2011 |
| WO | 2011134674 A1 | 11/2011 |
| WO | 2012065292 A1 | 5/2012 |
| WO | 2012150559 A1 | 11/2012 |
| WO | 2012150560 A1 | 11/2012 |
| WO | 2013021332 A1 | 2/2013 |
| WO | 2013061274 A1 | 5/2013 |
| WO | 2013173615 A1 | 11/2013 |

OTHER PUBLICATIONS

Chinese Patent No. 101885907 (A); Publication Date: Nov. 17, 2010; Abstract Only; 1 Page.
Chinese Patent No. 102134383 (A); Publication Date: Jul. 27, 2011; Abstract Only; 1 Page.
Japanese Patent No. 2004149623 (A); Publication Date: May 27, 2004; Abstract Only; 1 Page.
Japanese Patent No. 2004231935 (A); Publication Date: Aug. 19, 2004; Abstract Only; 1 Page.
Japanese Patent No. 2005037591 (A); Publication Date: Feb. 10, 2005; Abstract Only; 2 Pages.
Japanese Patent No. 2005048154 (A); Publication Date: Feb. 24, 2005; Abstract Only; 1 Page.
Japanese Patent No. 2005115051 (A); Publication Date: Apr. 28, 2005; Abstract Only; 1 Page.
Japanese Patent No. 2006339033 (A); Publication Date: Dec. 14, 2006; Abstract Only; 2 Pages.
Japanese Patent No. 2008184482 (A); Publication Date: Aug. 14, 2008; Abstract Only; 1 Page.
Japanese Patent No. 2011029051 (A); Publication Date: Feb. 10, 2011; Abstract Only; 2 Pages.
Anderson et al.; "Quantitative Analysis of Commercial Bisphenol A by Paper Chromatography"; Analytical Chemistry; vol. 31, No. 7; 1959; p. 1214-1217.
Brunelle, D.J.: "Polycarbonates", Encyclopedia of Polymer Science and Technology, Jan. 1, 2006, pp. I.1-33, XP002525090, DOI: 10.1002/0471440264PST255.PUB2, Retrieved from the Internet: URL: http://mrw.interscience.wiley.com/emrw/9780471440260/epst/article/pst255/current/abstract.
Brydia; "Determination of Bisphenol A and Impurities by Gas Chromatography of Their Trimethylsilyl Ether Derivatives" Analytical Chemistry; vol. 40, No. 14; 1968; pp. 2212-2215.
De Brouwer et al.; "Lexan* Polycarbonate for Optical Applications"; SABIC Innovative Plsatics; Received Aug. 2, 2011; 5 Pages.
Factor; "Search for the Sources of Color in Thermally Aged, Weathered and y-Ray Irradiated Bisphenol A Polycarbonate"; Die Angewandte Makromolekulare Chemie; vol. 232; 1995; pp. 27-43.
Factor et al.; "The Use of 31P NMR to Identify Color Bodies in y-irradiated Bisphenol-A Polycarbonate*"; Polymer Degradation and Stability; vol. 57; 1997; pp. 83-86.
Godinez et al.; "Experimental Study of the Influence of Raw Material Impurities on Yellowness Index of Transesterification Polycarbonate"; Journal of Applied Polymer Science; vol. 119; 2011; pp. 1348-1356.
Li et al.; "Design of Mechanically Robust High-Tg Polymers: Synthesis and Dynamic Machanical Relaxation Behavior of Glassy Poly(ester carbonate)s with Cyclohexylene Rings in the Backbone"; Macromolecules; vol. 36; 2003; pp. 9411-9420.
Nowakowska et al.; "Studies of Some Impurities in Commercial Bisphenol-A"; Polish Journal of Applied Chemistry; vol. XL, No. 3; 1996; pp. 247-254.
Poskrobko et al.; "High-Performance Liquid Chromatography wtih Multi-Wavelength Detection of the Bisphenol A Impurities"; Journal of Chromatography A; vol. 883; 2000; pp. 291-297.
Chan et al., "Facile Quantitative Analysis of Hydroxyl End Groups of Poly (2,6-dimethyl-1,4-phenylene oxide)s by 31P NMR Spectroscopy", Macromolecules (1994), vol. 27, pp. 6371-6375.
Chinese Patent No. 202091807 (U); Publication Date: Dec. 28, 2011; Abstract Only; 1 Page.
Japanese Patent No. 2005082713 (A); Publication Date: Mar. 31, 2005; Abstract Only; 2 Pages.
Liptak et al.; "Absolute pKa Determination for Substituted Phenols"; J. Am. Chem. Soc.; vol. 124; 2002; pp. 6421-6427.
Chou et al.; "The Optimum Conditions for Solid-State-Prepared (Y3-xCex)Al5O12 Phosphor Using the Taguchi Method"; Advanced Powder Technology; vol. 12; 2012; pp. 97-103.
International Search Report; International Application No. PCT/US2013/024405; International Filing Date: Feb. 1, 2013; Date of Mailing: May 15, 2013; 6 Pages.
Written Opinion of the International Searching Authority; International Application No. PCT/US2013/024405; International Filing Date: Feb. 1, 2013; Date of Mailing: May 15, 2013; 6 Pages.
Anonymous, "Polycarbonate preparation with a low yellowness index," Research Disclosure, Mason Publications, Hampshire GB vol. 449, No. 49 (Sep. 1, 2001) ISSN: 0374-4353 pp. 1-3.
Chou et al., "The optimum conditions for solid-state-prepared (Y3-xCex)Al5O12 phosphor using the Taguchi method", Advanced Powder Technology, vol. 23, Issue 1, Jan. 2012, pp. 97-103.
De Brouwer et al., U.S. Appl. No. 14/797,417 entitled "Polycarbonate Compositions Containing Conversions Material Chemistry and Having Enhanced Optical Properties, Methods of Making and Articles Comprising the Same", filed Jul. 13, 2015.
English Abstract of JP08038910(A); Date of Publication: Feb. 13, 1996; 1 Page.
English Abstract of JP08071433(A); Date of Publication: Mar. 19, 1996; 1 Page.
English Abstract of JP08325185(A); Date of Publication: Dec. 10, 1996; 2 Pages.
English Abstract of JP10211434(A); Date of Publication: Aug. 11, 1998; 2 Pages.
English Abstract of JP10251180(A); Date of Publication: Sep. 22, 1998; 1 Page.
English Abstract of JP10314595(A); Date of Publication: Dec. 2, 1998; 2 Pages.
English Abstract of JP10328573(A); Date of Publication: Dec. 15, 1998; 1 Page.
English Abstract of JP11179210(A); Date of Publication: Jul. 6, 1999; 2 Pages.
English Abstract of JP11246458(A); Date of Publication: Sep. 14, 1999; 1 Page.
English Abstract of JP11255748(A); Date of Publication: Sep. 21, 1999; 1 Page.
English Abstract of JP2000281607(A); Date of Publication: Oct. 10, 2000; 1 Page.
English Abstract of JP2000281608(A); Date of Publication: Oct. 10, 2000; 1 Page.
English Abstract of JP2000319216(A); Date of Publication: Nov. 21, 2000; 1 Page.
English Abstract of JP2001233812(A); Date of Publication: Aug. 28, 2001; 1 Page.
English Abstract of JP5271132(A); Date of Publication: Oct. 19, 1993; 2 Pages.
English Abstract of JP5294875(A); Date of Publication: Nov. 9, 1993; 2 Pages.
English Abstract of JP5294876(A); Date of Publication: Nov. 9, 1993; 1 Page.
Machine Translation of FR2685221(A1); Date of Publication: Jun. 25, 1993; 26 Pages.
Machine Translation of FR2685323(A1); Date of Publication: Jun. 25, 1993; 26 Pages.
Machine Translation of JP08319248(A); Date of Publication: Dec. 3, 1996; 8 Pages.

* cited by examiner

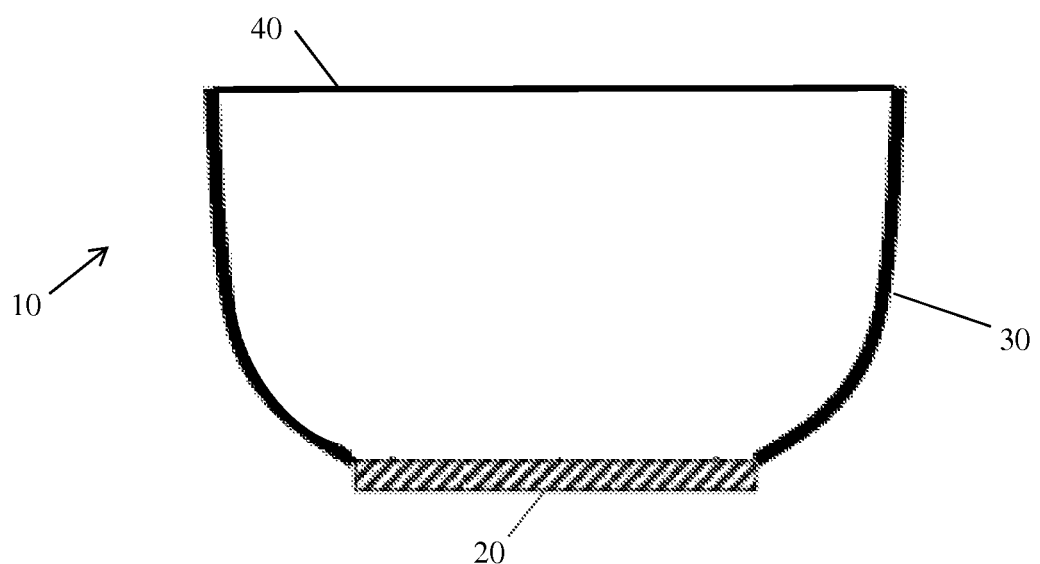

LIGHT EMITTING DIODE DEVICE AND METHOD FOR PRODUCTION THEREOF CONTAINING CONVERSION MATERIAL CHEMISTRY

CROSS REFERENCE TO RELATED APPLICATION

This application claims priority to U.S. Provisional Patent Application No. 61/594,813, filed Feb. 3, 2012, the entire contents of which are hereby incorporated by reference.

FIELD OF THE INVENTION

This disclosure relates to light emitting diodes (LEDs), materials for LEDs housing, methods of manufacture, and uses thereof.

BACKGROUND OF THE INVENTION

Light emitting diodes (LEDs) are currently used as replacements for incandescent light bulbs and fluorescent lamps. LEDs are semiconductor devices that emit incoherent narrow-spectrum light when electrically biased in the forward direction of their p-n junctions (boundary between P-type and N-type semiconductor), and are thus referred to as solid-state lighting devices.

When a light-emitting diode is forward biased (switched on), electrons are able to recombine with electron holes within the device, releasing energy in the form of photons. This effect is called electroluminescence and the color of the light (corresponding to the energy of the photon) is determined by the energy gap of the semiconductor. A LED is often small in area (less than 1 square millimeter ($mm^2$)), and integrated optical components may be used to shape its radiation pattern. LEDs powerful enough for room lighting are relatively expensive and require more precise current and heat management than compact fluorescent lamp sources of comparable output.

A LED that emits white light (a desired color characteristic) is one end goal for the lighting industry. With respect to housings, those made out of polymer compositions, e.g. polycarbonate, meeting industry requirements have been a challenge. Thus, there is a need for plastic containing material that meets these industry requirements as well as processes that effectuate the manufacture of materials that meet industry requirements.

SUMMARY OF THE INVENTION

Disclosed herein are light emitting devices, plastic molded devices, and methods for making and using the same.

In one embodiment, a light emitting device comprises: a lighting element located in a housing, wherein the housing is formed from a polymer composition comprising a polymer material and a coated conversion material. The conversion material comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials. After the conversion material has been exposed to an excitation source, the conversion material has a luminescence lifetime of less than $10^{-4}$ seconds when the excitation source is removed.

In one embodiment, a plastic molded device has a transparency of greater than or equal to 30%, wherein the article is formed from the polymer composition. The polymer composition comprises a polymer material and a coated conversion material. The conversion material comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials. After the conversion material has been exposed to an excitation source, the conversion material has a luminescence lifetime of less than $10^{-4}$ seconds when the excitation source is removed.

In an embodiment, a light emitting device comprises: a radiation source and an emitting portion in optical communication with the radiation source, wherein the emitting portion is formed from a polymer composition. The polymer composition comprises a polymer material and a coated conversion material. The conversion material comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials. After the conversion material has been exposed to an excitation source, the conversion material has a luminescence lifetime of less than $10^{-4}$ seconds when the excitation source is removed.

In another embodiment, a lighting device comprises: a radiation source configured to emit radiation having a first wavelength range and an optical component comprising a polymer composition. The polymer composition comprises a polymer material and a coated conversion material. The conversion material comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials. After the conversion material has been exposed to an excitation source, the conversion material has a luminescence lifetime of less than $10^{-4}$ seconds when the excitation source is removed. The conversion material is configured to absorb at least a portion of the first wavelength range radiation and emit radiation having a second wavelength range; wherein the optical component is configured such that at least the first wavelength range radiation passes though the optical component.

BRIEF DESCRIPTION OF THE DRAWINGS

FIG. 1 illustrates a cross-sectional view of a lighting arrangement.

DETAILED DESCRIPTION

Ranges articulated within this disclosure, e.g. numerics/values, shall include disclosure for possession purposes and claim purposes of the individual points within the range, sub-ranges, and combinations thereof.

Various combinations of elements of this disclosure are encompassed by this invention, e.g. combinations of elements from dependent claims that depend upon the same independent claim.

The word "about" should be given its ordinary and accustomed meaning and should be relative to the word or phrase(s) that it modifies. In the context of pKa, the word "about" as it pertains to pKa can equal the value of the numeric or can equal in the range of +/−0.1 of the pKa unit, e.g. pKa of about 8.3 can include 8.2, and the word "about" as it pertains to branching level can equal the value of the numeric or can equal in the range +/−0.05% of the branching level, e.g. about 1% can encompass 0.95%. The delineation of the word about in the context pKa and branching level should not in any way limit the ordinary and accustomed meaning of the word "about" for other language/numerics that the word "about" modifies.

As used herein, the term "conversion material" refers to an inorganic material that converts radiation of a certain wavelength and re-emits of a different wavelength (much lower energy). A conversion material that causes luminescence and/or scintillation (which is characterized by energy loss of ionizing radiation through matter) may exist, for example, in the powder form or as a transparent single crystal. The conversion material converts some of the blue light from a blue LED to yellow light and the overall combination of available light is perceived as white light to an observer. The lifetime of yellow light produced in this manner (or other colors from conversion material(s)) is very short, lasting less than $10^{-4}$ seconds (i.e., lifetime when the excitation source is removed). Lifetimes of this order may be regarded as fluorescence lifetimes (lasting less than $10^{-4}$ seconds, e.g, lasting $10^{-4}$ to $10^{-9}$ seconds). A conversion material does not produce a long afterglow (lifetime duration generally lasting minutes and even hours). When the excitation source is removed, luminescence ceases (i.e., no long after-glow).

The notation ($C_n$-$C_m$) and the notation ($C_{n-m}$) means a group containing from n to m carbon atoms per group.

"Melt-Volumetric Rate" (MVR) of a molten polymer is measured by determining the amount of polymer that flows through a capillary of a specific temperature over a specified time using standard weights at a fixed temperature. MVR is expressed in cubic centimeter per 10 minutes (cc/10 min). The higher the MVR value of a polymer at a specific temperature, the greater the flow of that polymer at that specific temperature. As used herein, MVR is determined in accordance with ASTM D1238-10 at a temperature of 300° C., after extrusion into a pellet, with a weight of 1.2 kilogram (kg).

The pKa values used in the model for the end-capping agents are listed in Table 1 below:

TABLE 1

| End-capping agent | pKa* |
| --- | --- |
| p-cyanophenol | 8.2 |
| p-methyl-hydroxy benzoate | 8.4 |
| phenol | 9.9 |
| p-t-butylphenol | 10.2 |
| p-methoxyphenol | 10.4 |
| p-cumylphenol | 10.5 |

*pKa values for all of the end-capping agents but p-t-butyl phenol and p-cumylphenol were obtained from the following reference: J. AM. CHEM. SOC. 2002, 6424. The values chosen in the reference were listed in the S7 category in Table 3 of the reference. The pKa value for p-t-butylphenol was obtained from the following reference: Journal of Molecular Structure: THEOCHEM 805, 2006, 31. The pKa for methyl-p-hydroxybenzoate was obtained from the following reference: Chromatographia Vol. 39, No. 5/6, September 1994. The pKa value for p-cumylphenol was approximated based on the values of similar structures.

"Transparency" as used herein refers to that percentage of transmitted light, which in passing through a specimen deviates from the incident beam by forward scattering. Percent (%) transparency can be measured according to ASTM D1003-00, Procedure B, illuminant C, on a spectrophotometer.

"Combination" is inclusive of blends, mixtures, alloys, reaction products, and the like. Furthermore, the terms "first," "second," and the like, herein do not denote any order, quantity, or importance, but rather are used to distinguish one element from another. The terms "a" and "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the film(s) includes one or more films). Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

In general, the invention may alternately comprise, consist of, or consist essentially of, any appropriate components disclosed herein. The invention may additionally, or alternatively, be formulated so as to be devoid, or substantially free, of any components, materials, ingredients, adjuvants or species used in the prior art compositions or that are otherwise not necessary to the achievement of the function and/or objectives of the present invention.

All cited patents, patent applications, and other references are incorporated herein by reference in their entirety. However, if a term in the present application contradicts or conflicts with a term in the incorporated reference, the term from the present application takes precedence over the conflicting term from the incorporated reference. For example, WO 2011/134674 A1 to Zhou et al. is hereby incorporated by reference.

One avenue for achieving the desired white light is to utilize conversion material chemistry in LED housings, specifically incorporating conversion materials throughout the LED housing, e.g., in close proximity to the LED. Conversion materials, e.g., luminescent materials, which emit light of longer wavelengths than that of the excitation source, include those having a solid inorganic host lattice doped with rare-earth elements. Conversion materials can be incorporated within a polymeric substrate by either coatings or being compounded directly into the polymer matrix during extrusion. However, such conversion materials are expected to degrade the polymer (e.g., polycarbonate) when incorporated into the polymer melt during extrusion. For example, polycarbonate melt stability is expected to decrease and the general color of the conversion material, before and during LED excitation will likely produce an undesirable effect. Loss of melt stability could lead to at least one of the following: embrittlement and undesirable resin color. Resin yellowing can affect correlated color temperature (downward shift), color rendering index, and decreased luminous efficacy. Furthermore, loss of melt stability could negatively affect the molder's ability to accurately mold a flat disk or sphere shaped optic, wherein the molded conversion material optic needs uniform surface features and reliable shrink properties for optimal light modeling (ray tracing), production quality, and angular color uniformity.

It is further noted that diminished flame retardant properties are anticipated in parts molded from degraded resin. As a result, luminaire designers will be limited while attempting to specify a polymer material with an inadequate UL rating, e.g., a thin wall flame retardancy is desired (e.g., a UL94 V0 rating at less than or equal to 1.5 millimeters (mm)).

Optimized polymer and conversion material and optical properties are needed so that the LED lighting products can meet Department of Energy (DOE) Energy Star rating using measurement methods described in IESNA LM-79 and IES LM-80-08. Thus, there is a need in the art to satisfy this requirement.

Some or all of the above needs can be met with a light emitting comprising a lighting element 20 located in a housing 30, wherein the housing 30 (see e.g., FIG. 1) is formed from a polymer composition comprising a polymer material and a coated conversion material. The coated conversion material can, for example, absorb at least a portion of a first wavelength range radiation that is emitted from the light emitting device and emits radiation having a second wavelength range. This results in an altered light color perception by the viewer. For example, the conversion material can convert some of the blue light from a blue LED to yellow light and the overall combination of available light is perceived as white light to an observer. In this manner light emitting LEDs can effectively be tuned to result in different color than those immediately emitted from the LED. Further, by incorporating the coated conversion material(s) into the plastic housing, industry requirements as well as processes that effectuate the manufacture of materials can be met.

As shown in FIG. 1, lighting arrangement 10 can include housing 30 (e.g., an enclosure) or lens 40 or emitting portion of a LED 20 contains a polymer.

The polymer material can be derived from the following: polyolefins, such as polyethylene (PE) and polypropylene (PP), polyesters, such as polyalkylene terephthalates, such as polyethylene terephthalates (PET) and polybutylene terephthalate (PBT), cyanoacrylate (CA), cellulose triacetate (CTA), ethyl vinyl acetate (EVA), propyl vinyl acetate (PVA), polyvinylbutyral (PVB), polyvinyl chloride (PVC), polycarbonate (PC), polyethylene naphthalate (PEN), polyurethane (PU), thermoplastic polyurethane (TPU), polyamide (PA), polymethyl methacrylate (PMMA), polystyrene (PS), cellulose nitrate, and combinations comprising at least one of the foregoing polymer materials, e.g., copolymers from at least two of the monomers of the aforementioned polymers and mixtures of two or more of these polymers.

In an embodiment, the polymer material of the polymer composition can comprise a polycarbonate. Descriptions of the various types of polycarbonates are articulated below, but should not be construed as limiting.

Various types of polycarbonates that have a repeating structural background of the following formula:

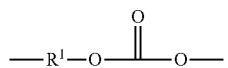

can be utilized.

The selection of a polycarbonate backbone of choice depends on many factors such as end use and other factors understood by one of ordinary skill the art.

In one embodiment, the polycarbonates have repeating structural carbonate units of the formula (1):

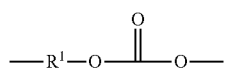

(1)

wherein greater than or equal to 60 percent of the total number of $R^1$ groups contain aromatic organic groups and the balance thereof are aliphatic, alicyclic, or aromatic groups.

The polycarbonate can be derived from bisphenol-A.

Each $R^1$ group can be a divalent aromatic group, for example derived from an aromatic dihydroxy compound of the formula (2):

$$HO-A^1-Y^1-A^2-OH \qquad (2)$$

wherein each of $A^1$ and $A^2$ is a monocyclic divalent arylene group, and $Y^1$ is a single bond or a bridging group having one or two atoms that separate $A^1$ from $A^2$. For example, one atom can separate $A^1$ from $A^2$. In another example, when each of $A^1$ and $A^2$ is phenylene, $Y^1$ is para to each of the hydroxyl groups on the phenylenes. Illustrative non-limiting examples of groups of this type are —O—, —S—, —S(O)—, —S(O)$_2$—, —C(O)—, methylene, cyclohexylmethylene, 2-[2.2.1]-bicycloheptylidene, ethylidene, isopropylidene, neopentylidene, cyclohexylidene, cyclopentadecylidene, cyclododecylidene, and adamantylidene. The bridging group $Y^1$ can be a hydrocarbon group or a saturated hydrocarbon group such as methylene, cyclohexylidene, or isopropylidene.

Included within the scope of formula (2) are bisphenol compounds of general formula (3):

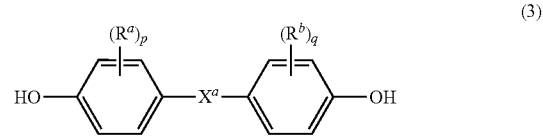

(3)

wherein $R^a$ and $R^b$ each represent a halogen atom or a monovalent hydrocarbon group and can be the same or different; p and q are each independently integers of 0 to 4; and $X^a$ represents a single bond or one of the groups of formulas (4) or (5):

(4)

(5)

wherein $R^c$ and $R^d$ are each independently hydrogen, $C_{1-12}$ alkyl, $C_{1-12}$ cycloalkyl, $C_{7-12}$ arylalkyl, $C_{1-12}$ heteroalkyl, or cyclic $C_{7-12}$ heteroarylalkyl, and $R^e$ is a divalent $C_{1-12}$ hydrocarbon group. In particular, $R^c$ and $R^d$ are each the same hydrogen or $C_{1-4}$ alkyl group, specifically the same $C_{1-3}$ alkyl group, even more specifically, methyl.

$R^c$ and $R^d$ taken together can represent a $C_{3-20}$ cyclic alkylene group or a heteroatom-containing $C_{3-20}$ cyclic alkylene group comprising carbon atoms and heteroatoms with a valency of two or greater. These groups can be in the form of a single saturated or unsaturated ring, or a fused polycyclic ring system wherein the fused rings are saturated, unsaturated, or aromatic. A specific heteroatom-containing cyclic alkylene group comprises at least one heteroatom with a valency of 2 or greater, and at least two carbon atoms. Examples of heteroatoms in the heteroatom-containing cyclic alkylene group include —O—, —S—, and —N(Z)—, where Z is a substituent group selected from hydrogen, hydroxy, $C_{1-12}$ alkyl, $C_{1-12}$ alkoxy, or $C_{1-12}$ acyl.

In a specific exemplary embodiment, $X^a$ is a substituted $C_{3-18}$ cycloalkylidene of the formula (6):

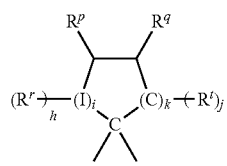
(6)

wherein each $R^r$, $R^P$, $R^q$, and $R^t$ is independently hydrogen, halogen, oxygen, or $C_{1-12}$ organic group; I is a direct bond, a carbon, or a divalent oxygen, sulfur, or —N(Z)— wherein Z is hydrogen, halogen, hydroxy, $C_{1-12}$ alkyl, $C_{1-12}$ alkoxy, or $C_{1-12}$ acyl; h is 0 to 2, j is 1 or 2, i is an integer of 0 or 1, and k is an integer of 0 to 3, with the proviso that at least two of $R^r$, $R^P$, $R^q$, and $R^t$ taken together are a fused cycloaliphatic, aromatic, or heteroaromatic ring. It will be understood that where the fused ring is aromatic, the ring as shown in formula (6) will have an unsaturated carbon-carbon linkage where the ring is fused. When k is 1 and i is 0, the ring as shown in formula (6) contains 4 carbon atoms, when k is 2, the ring as shown contains 5 carbon atoms, and when k is 3, the ring contains 6 carbon atoms. Two adjacent groups (e.g., $R^q$ and $R^t$ taken together) can form an aromatic group, and/or $R^r$ and $R^P$ taken together form a second aromatic group.

Non-limiting examples of dihydroxy compounds that can provide polycarbonates with Tgs greater than 170° C. include 3,3-bis(4-hydroxyphenyl)-2-phenylisoindolin-1-one (PPPBP), 1,1-bis(4-hydroxyphenyl)-3,3,5-trimethylcyclohexane) (Bisphenol TMC), 4,4'-(1-phenylethane-1,1-diyl) diphenol (bisphenol AP) as well as adamantyl containing aromatic dihydroxy compounds and flourene containing aromatic dihydroxy compounds.

Specific example of dihydroxy compounds of formula (2) can be the following formula (7):

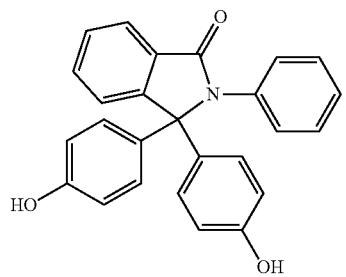
(7)

(also known as 3,3-bis(4-hydroxyphenyl)-2-phenylisoindolin-1-one (PPPBP)) also known as 2-phenyl-3,3-bis(4-hydroxyphenyl)phthalimidine.

Alternatively, the dihydroxy compounds of formula (2) may be the following formula (8):

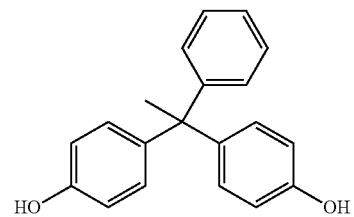
(8)

(also known as 4,4'-(1-phenylethane-1,1-diyl)diphenol (bisphenol AP) also known as 1,1-bis(4-hydroxyphenyl)-1-phenyl-ethane).

Alternatively, the dihydroxy compounds of formula (2) may be the following formula (9):

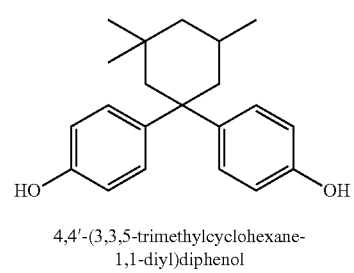
(9)

4,4'-(3,3,5-trimethylcyclohexane-1,1-diyl)diphenol (bisphenol TMC) also known as 1,1-bis(4-hydroxyphenyl)-3,3,5-trimethylcyclohexane). Examples of adamantyl containing aromatic dihydroxy compounds and flourene containing aromatic dihydroxy compounds are set forth in Formulas (A) and (B) respectively.

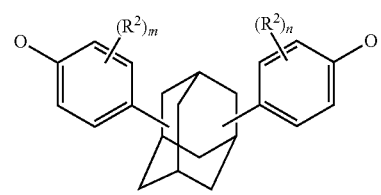
(A)

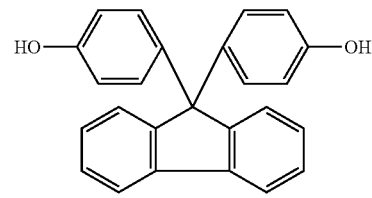
(B)

Another possible polycarbonate with high Tg is set forth in formula (C):

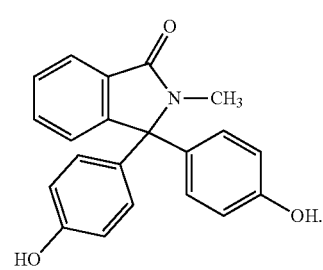
(C)

A polycarbonate can have a bisphenol of formula (D) as a repeating monomer unit therein:

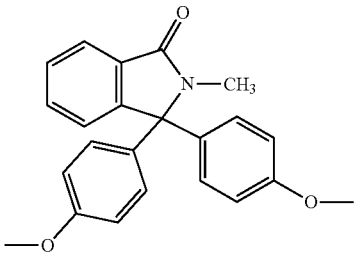

When k is 3 and i is 0, bisphenols containing substituted or unsubstituted cyclohexane units are used, for example bisphenols of formula (10):

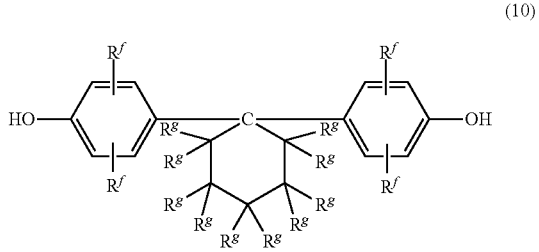

wherein each $R^f$ is independently hydrogen, $C_{1-12}$ alkyl, or halogen; and each $R^g$ is independently hydrogen or $C_{1-12}$ alkyl. The substituents can be aliphatic or aromatic, straight chain, cyclic, bicyclic, branched, saturated, or unsaturated. Such cyclohexane-containing bisphenols, for example the reaction product of two moles of a phenol with one mole of a hydrogenated isophorone, are useful for making polycarbonate polymers with high glass transition temperatures and high heat distortion temperatures. Cyclohexyl bisphenol containing polycarbonates, or a combination comprising at least one of the foregoing with other bisphenol polycarbonates, are supplied by Bayer Co. under the APEC™ trade name.

Other useful dihydroxy compounds having the formula HO—$R^1$—OH include aromatic dihydroxy compounds of formula (11):

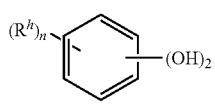

wherein each $R^h$ is independently a halogen atom, a $C_{1-10}$ hydrocarbyl such as a $C_{1-10}$ alkyl group, a halogen substituted $C_{1-10}$ hydrocarbyl such as a halogen-substituted $C_{1-10}$ alkyl group, and n is 0 to 4. The halogen is usually bromine.

Some illustrative examples of dihydroxy compounds include the following: 4,4'-dihydroxybiphenyl, 1,6-dihydroxynaphthalene, 2,6-dihydroxynaphthalene, bis(4-hydroxyphenyl)methane, bis(4-hydroxyphenyl)diphenylmethane, bis(4-hydroxyphenyl)-1-naphthylmethane, 1,2-bis(4-hydroxyphenyl)ethane, 1,1-bis(4-hydroxyphenyl)-1-phenylethane, 2-(4-hydroxyphenyl)-2-(3-hydroxyphenyl) propane, bis(4-hydroxyphenyl)phenylmethane, 2,2-bis(4-hydroxy-3-bromophenyl)propane, 1,1-bis(hydroxyphenyl) cyclopentane, 1,1-bis(4-hydroxyphenyl)cyclohexane, 1,1-bis(4-hydroxyphenyl)isobutene, 1,1-bis(4-hydroxyphenyl) cyclododecane, trans-2,3-bis(4-hydroxyphenyl)-2-butene, 2,2-bis(4-hydroxyphenyl)adamantine, alpha,alpha'-bis(4-hydroxyphenyl)toluene, bis(4-hydroxyphenyl)acetonitrile, 2,2-bis(3-methyl-4-hydroxyphenyl)propane, 2,2-bis(3-ethyl-4-hydroxyphenyl)propane, 2,2-bis(3-n-propyl-4-hydroxyphenyl)propane, 2,2-bis(3-isopropyl-4-hydroxyphenyl)propane, 2,2-bis(3-sec-butyl-4-hydroxyphenyl)propane, 2,2-bis(3-t-butyl-4-hydroxyphenyl)propane, 2,2-bis(3-cyclohexyl-4-hydroxyphenyl)propane, 2,2-bis(3-allyl-4-hydroxyphenyl)propane, 2,2-bis(3-methoxy-4-hydroxyphenyl)propane, 2,2-bis(4-hydroxyphenyl)hexafluoropropane, 1,1-dichloro-2,2-bis(4-hydroxyphenyl)ethylene, 1,1-dibromo-2,2-bis(4-hydroxyphenyl)ethylene, 1,1-dichloro-2,2-bis(5-phenoxy-4-hydroxyphenyl)ethylene, 4,4'-dihydroxybenzophenone, 3,3-bis(4-hydroxyphenyl)-2-butanone, 1,6-bis(4-hydroxyphenyl)-1,6-hexanedione, ethylene glycol bis (4-hydroxyphenyl)ether, bis(4-hydroxyphenyl)ether, bis(4-hydroxyphenyl)sulfide, bis(4-hydroxyphenyl)sulfoxide, bis (4-hydroxyphenyl)sulfone, 9,9-bis(4-hydroxyphenyl) fluorine, 2,7-dihydroxypyrene, 6,6'-dihydroxy-3,3,3',3'-tetramethylspiro(bis)indane ("spirobiindane bisphenol"), 3,3-bis(4-hydroxyphenyl)phthalide, 2,6-dihydroxydibenzo-p-dioxin, 2,6-dihydroxythianthrene, 2,7-dihydroxyphenoxathin, 2,7-dihydroxy-9,10-dimethylphenazine, 3,6-dihydroxydibenzofuran, 3,6-dihydroxydibenzothiophene, and 2,7-dihydroxycarbazole, resorcinol, substituted resorcinol compounds such as 5-methyl resorcinol, 5-ethyl resorcinol, 5-propyl resorcinol, 5-butyl resorcinol, 5-t-butyl resorcinol, 5-phenyl resorcinol, 5-cumyl resorcinol, 2,4,5,6-tetrafluoro resorcinol, 2,4,5,6-tetrabromo resorcinol, or the like; catechol; hydroquinone; substituted hydroquinones such as 2-methyl hydroquinone, 2-ethyl hydroquinone, 2-propyl hydroquinone, 2-butyl hydroquinone, 2-t-butyl hydroquinone, 2-phenyl hydroquinone, 2-cumyl hydroquinone, 2,3, 5,6-tetramethyl hydroquinone, 2,3,5,6-tetra-t-butyl hydroquinone, 2,3,5,6-tetrafluoro hydroquinone, 2,3,5,6-tetrabromo hydroquinone, and the like, as well as combinations comprising at least one of the foregoing dihydroxy compounds.

Specific examples of bisphenol compounds that can be represented by formula (2) include 1,1-bis(4-hydroxyphenyl)methane, 1,1-bis(4-hydroxyphenyl)ethane, 2,2-bis(4-hydroxyphenyl)propane (hereinafter "bisphenol A" or "BPA"), 2,2-bis(4-hydroxyphenyl) butane, 2,2-bis(4-hydroxyphenyl)octane, 1,1-bis(4-hydroxyphenyl)propane, 1,1-bis(4-hydroxyphenyl)n-butane, 2,2-bis(4-hydroxy-1-methylphenyl)propane, 1,1-bis(4-hydroxy-t-butylphenyl) propane, 3,3-bis(4-hydroxyphenyl)phthalimidine, 2-phenyl-3,3-bis(4-hydroxyphenyl)phthalimidine (PPPBP), and 1,1-bis(4-hydroxy-3-methylphenyl)cyclohexane (DMBPC). Combinations comprising at least one of the foregoing dihydroxy compounds can also be used.

"Polycarbonate" as used herein includes homopolycarbonates, copolymers comprising different $R^1$ moieties in the carbonate (also referred to herein as "copolycarbonates"), and copolymers comprising carbonate units and other types of polymer units, such as ester units. The polycarbonate can be a linear homopolymer or copolymer comprising units derived from bisphenol A, in which each of $A^1$ and $A^2$ is p-phenylene and $Y^1$ is isopropylidene in formula (2). More specifically, greater than or equal to 60%, particularly greater than or equal to 80% of the $R^1$ groups in the polycarbonate are derived from bisphenol A.

Another specific type of copolymer is a polyester carbonate, also known as a polyester-polycarbonate. Such copolymers further contain, in addition to recurring carbonate chain units of the formula (1), repeating units of formula (9):

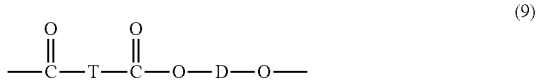

(9)

wherein D is a divalent group derived from a dihydroxy compound, and can be, for example, a $C_2$-$C_{10}$ alkylene group, a $C_6$-$C_{20}$ alicyclic group, a $C_6$-$C_{20}$ aromatic group or a polyoxyalkylene group in which the alkylene groups contain 2 to 6 carbon atoms, specifically 2, 3, or 4 carbon atoms; and T divalent group derived from a dicarboxylic acid, and can be, for example, a $C_2$-$C_{10}$ alkylene group, a $C_6$-$C_{20}$ alicyclic group, a $C_6$-$C_{20}$ alkyl aromatic group, or a $C_6$-$C_{20}$ aromatic group.

D can be a $C_2$ to $C_{30}$ alkylene group having a straight chain, branched chain, or cyclic (including polycyclic) structure. D can be derived from an aromatic dihydroxy compound of formula (3) above of formula (8) above.

Examples of aromatic dicarboxylic acids that can be used to prepare the polyester units include isophthalic or terephthalic acid, 1,2-di(p-carboxyphenyl)ethane, 4,4'-dicarboxydiphenyl ether, 4,4'-bisbenzoic acid, and combinations comprising at least one of the foregoing acids. Acids containing fused rings can also be present, such as in 1,4-, 1,5-, or 2,6-naphthalenedicarboxylic acids. Specific dicarboxylic acids are terephthalic acid, isophthalic acid, naphthalene dicarboxylic acid, cyclohexane dicarboxylic acid, or combinations comprising at least one of the foregoing. A specific dicarboxylic acid comprises a combination of isophthalic acid and terephthalic acid wherein the weight ratio of isophthalic acid to terephthalic acid is 91:9 to 2:98. In another specific embodiment, D is a $C_{2-6}$ alkylene group and T is p-phenylene, m-phenylene, naphthalene, a divalent cycloaliphatic group, or a combination thereof. This class of polyester includes the poly(alkylene terephthalates).

The molar ratio of ester units to carbonate units in the copolymers can vary broadly, for example 1:99 to 99:1, specifically 10:90 to 90:10, more specifically 25:75 to 75:25, depending on the desired properties of the final composition.

In a specific embodiment, the polyester unit of a polyester-polycarbonate can be derived from the reaction of a combination of isophthalic and terephthalic diacids (or derivatives thereof) with resorcinol. In another specific embodiment, the polyester unit of a polyester-polycarbonate is derived from the reaction of a combination of isophthalic acid and terephthalic acid with bisphenol-A. In a specific embodiment, the polycarbonate units are derived from bisphenol A. In another specific embodiment, the polycarbonate units are derived from resorcinol and bisphenol A in a molar ratio of resorcinol carbonate units to bisphenol A carbonate units of 1:99 to 99:1.

A specific example of a polycarbonate-polyester is a copolycarbonate-polyester-polysiloxane terpolymer comprising carbonate units of formula (1), ester units of formula (9), and polysiloxane (also referred to herein as "polydiorganosiloxane") units of formula (10):

(10)

wherein each occurrence of R is same or different, and is a $C_{1-13}$ monovalent organic group. For example, R may independently be a $C_{1-13}$ alkyl group, $C_{1-13}$ alkoxy group, $C_{2-13}$ alkenyl group, $C_{2-13}$ alkenyloxy group, $C_{3-6}$ cycloalkyl group, $C_{3-6}$ cycloalkoxy group, $C_{6-14}$ aryl group, $C_{6-10}$ aryloxy group, $C_{7-13}$ arylalkyl group, $C_{7-13}$ arylalkoxy group, $C_{7-13}$ alkylaryl group, or $C_{7-13}$ alkylaryloxy group. The foregoing groups may be fully or partially halogenated with fluorine, chlorine, bromine, or iodine, or a combination thereof. Combinations of the foregoing R groups may be used in the same copolymer. In an embodiment, the polysiloxane comprises R groups that have a minimum hydrocarbon content. In a specific embodiment, an R group with a minimum hydrocarbon content is a methyl group.

The value of E in formula (10) may vary widely depending on the type and relative amount of each component in the plastic (e.g., thermoplastic) composition, the desired properties of the composition, and like considerations. Herein, E has an average value of 5 to 200, with the specific amount chosen so that a 1.0 mm thick plaque of the polymer composition (i.e., polymer material, coated conversion material(s), any additive(s)) has a transparency (% T) of greater than or equal to 30%. It is readily understood by an artisan that the E value is chosen (e.g., adjusted such as when the amount of siloxane in the material and when the siloxane is introduced to form the material and/or the process for making the material) to achieve a balance between transparency, flame retardancy, and impact. In an embodiment, E has an average value of 16 to 50, specifically 20 to 45, and more specifically 25 to 45. In another embodiment, E has an average value of 4 to 15, specifically 5 to 15, more specifically 6 to 15, and still more specifically 7 to 12.

In an embodiment, polydiorganosiloxane units are derived from dihydroxy aromatic compound of formula (11):

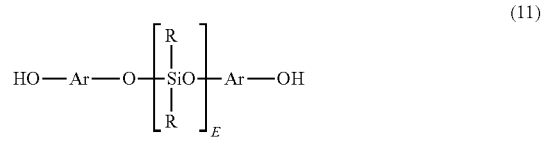

(11)

wherein E is as defined above; each R may independently be the same or different, and is as defined above; and each Ar may independently be the same or different, and is a substituted or unsubstituted $C_{6-30}$ arylene group, wherein the bonds are directly connected to an aromatic moiety. Suitable Ar groups in formula (11) may be derived from a $C_{6-30}$ dihydroxy aromatic compound, for example a dihydroxy aromatic compound of formula (2), (3), (7), or (8) above. Combinations comprising at least one of the foregoing dihydroxy aromatic compounds may also be used. Examples of dihydroxy aromatic compounds include resorcinol (i.e., 1,3-dihydroxybenzene), 4-methyl-1,3-dihydroxybenzene, 5-methyl-1,3-dihydroxybenzene, 4,6-dimethyl-1,3-dihydroxybenzene, 1,4-dihydroxybenzene, 1,1-bis(4-hydroxyphenyl)methane, 1,1-bis(4-hydroxyphenyl)ethane, 2,2-bis(4-hydroxyphenyl) propane, 2,2-bis(4-hydroxyphenyl) butane, 2,2-bis(4-hydroxyphenyl)octane, 1,1-bis(4-hydroxyphenyl)propane, 1,1-bis(4-hydroxyphenyl)n-butane, 2,2-bis(4-hydroxy-1-methylphenyl)propane, 1,1-bis(4-hydroxyphenyl)cyclohexane, bis(4-hydroxyphenyl sulfide), and 1,1-bis(4-hydroxy-t-butylphenyl)propane. Combinations comprising at least one of the foregoing dihydroxy compounds may also be used. In an embodiment, the dihydroxy aromatic compound is unsubstituted, or is not substituted with non-aromatic hydrocarbon-containing substituents such as, for example, alkyl, alkoxy, or alkylene substituents.

In a specific embodiment, where Ar is derived from resorcinol, the polydiorganosiloxane repeating units are derived from dihydroxy aromatic compounds of formula (12):

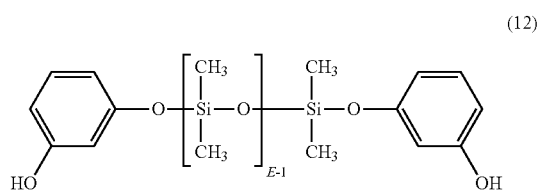

(12)

or, where Ar is derived from bisphenol-A, from dihydroxy aromatic compounds of formula (13):

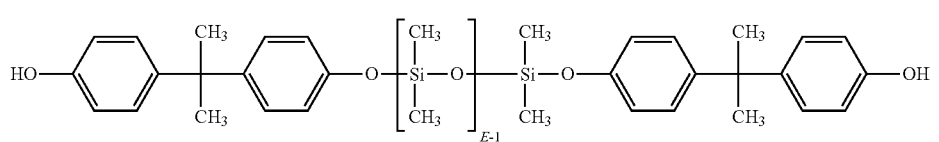

(13)

wherein E is as defined above.

In another embodiment, polydiorganosiloxane units are derived from dihydroxy aromatic compound of formula (14):

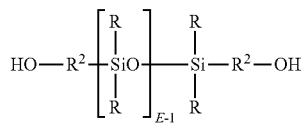

(14)

wherein R and E are as described above, and each occurrence of $R^2$ is independently a divalent $C_{1-30}$ alkylene or $C_{7-30}$ arylene-alkylene, and wherein the polymerized polysiloxane unit is the reaction residue of its corresponding dihydroxy aromatic compound. In a specific embodiment, where $R^2$ is $C_{7-30}$ arylene-alkylene, the polydiorganosiloxane units are derived from dihydroxy aromatic compound of formula (15):

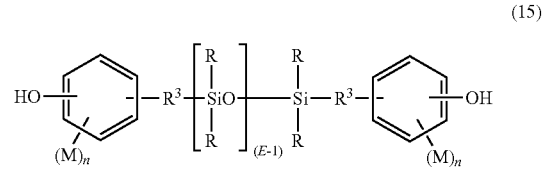

(15)

wherein R and E are as defined above. Each $R^3$ is independently a divalent $C_{2-8}$ aliphatic group. Each M may be the same or different, and may be a halogen, cyano, nitro, $C_{1-8}$ alkylthio, $C_{1-8}$ alkyl, $C_{1-8}$ alkoxy, $C_{2-8}$ alkenyl, $C_{2-8}$ alkenyloxy group, $C_{3-8}$ cycloalkyl, $C_{3-8}$ cycloalkoxy, $C_{6-10}$ aryl, $C_{6-10}$ aryloxy, $C_{7-12}$ arylalkyl, $C_{7-12}$ arylalkoxy, $C_{7-12}$ alkylaryl, or $C_{7-12}$ alkylaryloxy, wherein each n is independently 0, 1, 2, 3, or 4.

In an embodiment, M is bromo or chloro, an alkyl group such as methyl, ethyl, or propyl, an alkoxy group such as methoxy, ethoxy, or propoxy, or an aryl group such as phenyl, chlorophenyl, or tolyl; $R^3$ is a dimethylene, trimethylene or tetramethylene group; and R is a $C_{1-8}$ alkyl, haloalkyl such as trifluoropropyl, cyanoalkyl, or aryl such as phenyl, chlorophenyl or tolyl. In another embodiment, R is methyl, or a combination of methyl and trifluoropropyl, or a combination of methyl and phenyl. In still another embodiment, M is methoxy, n is 0 or 1, $R^3$ is a divalent $C_{1-3}$ aliphatic group, and R is methyl.

In a specific embodiment, the polydiorganosiloxane units are derived from a dihydroxy aromatic compound of formula (16):

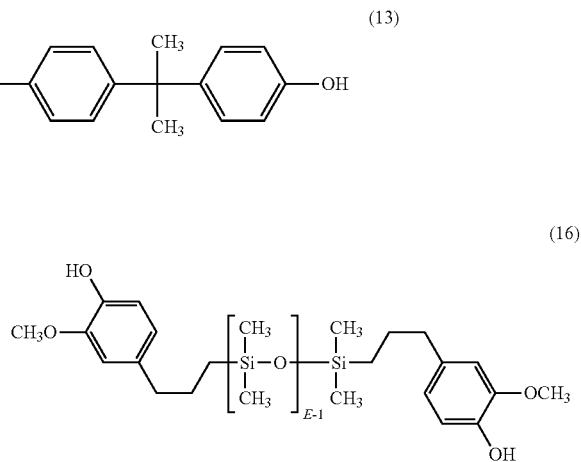

(16)

wherein E is as described above.

In another specific embodiment, the polydiorganosiloxane units are derived from dihydroxy aromatic compound of formula (17):

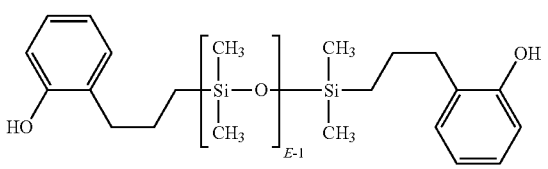

(17)

wherein E is as defined above.

Dihydroxy polysiloxanes typically can be made by functionalizing a substituted siloxane oligomer of formula (18):

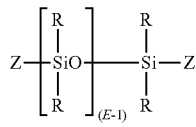

(18)

wherein R and E are as previously defined, and Z is H, halogen (Cl, Br, I), or carboxylate. Examples of carboxylates include acetate, formate, benzoate, and the like. In an exemplary embodiment, where Z is H, compounds of formula (18) may be prepared by platinum catalyzed addition with an aliphatically unsaturated monohydric phenol. Examples of aliphatically unsaturated monohydric phenols include eugenol, 2-allylphenol, 4-allylphenol, 4-allyl-2-methylphenol, 4-allyl-2-phenylphenol, 4-allyl-2-bromophenol, 4-allyl-2-t-butoxyphenol, 4-phenyl-2-allylphenol, 2-methyl-4-propenylphenol, 2-allyl-4,6-dimethylphenol, 2-allyl-4-bromo-6-methylphenol, 2-allyl-6-methoxy-4-methylphenol, and 2-allyl-4,6-dimethylphenol. Combinations comprising at least one of the foregoing may also be used. Where Z is halogen or carboxylate, functionalization may be accomplished by reaction with a dihydroxy aromatic compound of formulas (2), (3), (7), (8), or a combination comprising at least one of the foregoing dihydroxy aromatic compounds. In an embodiment, compounds of formula (12) may be formed from an alpha,omega-bisacetoxypolydiorangonosiloxane and a dihydroxy aromatic compound under phase transfer conditions.

A copolycarbonate terpolymer can be used. Specific copolycarbonate terpolymers include those with polycarbonate units of formula (1) wherein $R^1$ is a $C_{6-30}$ arylene group, polysiloxane units derived from siloxane diols of formula (13), (16) or (17), and polyester units wherein T is a $C_{6-30}$ arylene group. In an embodiment, T is derived from isophthalic and/or terephthalic acid, or reactive chemical equivalents thereof. In another embodiment, $R^1$ is derived from the carbonate reaction product of a resorcinol of formula (8), or a combination of a resorcinol of formula (8) and a bisphenol of formula (4).

The relative amount of each type of unit in the foregoing terpolymer will depend on the desired properties of the terpolymer, and are readily determined by one of ordinary skill in the art without undue experimentation, using the guidelines provided herein. For example, the polycarbonate-polyester-polysiloxane terpolymer can comprise siloxane units in an amount of 0.1 to 25 weight percent (wt %), specifically 0.2 to 10 wt %, more specifically 0.2 to 6 wt %, even more specifically 0.2 to 5 wt %, and still more specifically 0.25 to 2 wt %, based on the total weight of the polycarbonate-polyester-polysiloxane terpolymer, with the proviso that the siloxane units are provided by polysiloxane units covalently bonded in the polymer backbone of the polycarbonate-polyester-polysiloxane terpolymer. The polycarbonate-polyester-polysiloxane terpolymer can further comprise 0.1 to 49.85 wt % carbonate units, 50 to 99.7 wt % ester units, and 0.2 to 6 wt % polysiloxane units, based on the total weight of the polysiloxane units, ester units, and carbonate units. Alternatively, the polycarbonate-polyester-polysiloxane terpolymer comprises 0.25 to 2 wt % polysiloxane units, 60 to 96.75 wt % ester units, and 3.25 to 39.75 wt % carbonate units, based on the total weight of the polysiloxane units, ester units, and carbonate units. The specific amount of terpolymer and the composition of the terpolymer will be chosen so that a 1.0 mm thick plaque of the composition transparency (% T) of greater than or equal to 30%.

A method of making an article of manufacture that has a V0 94 rating at a thickness of 2.0 mm (specifically at a thickness of 1.5 mm) comprises: (a) providing a polycarbonate, wherein the polycarbonate has a repeating structural background of the following formula

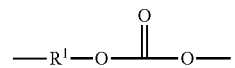

wherein greater than or equal to 60 percent of the total number of $R^1$ groups contain aromatic organic groups and the balance thereof are aliphatic, alicyclic, or aromatic groups; an end capping agent; a branching agent; (b) selecting the end-capping agent based upon the molecular weight of the polycarbonate and the branching level imparted by the branching agent, wherein the MVR of the polycarbonate is 1 to 15 cubic centimeter per 10 minutes ($cm^3/10$ min) and wherein the pKa of the end-capping agent is 8.3 to 11; (c) forming a polycarbonate containing the end-capping agent and the branching that has a peak melt viscosity of greater than or equal to 8,000 poise when measured using a parallel plate melt rheology test at a heating rate of 10° C./min at a temperature of 350° C. to 450° C.; and (d) blending a conversion material and a flame retardant with the formed polycarbonate.

The peak melt viscosity can be greater than or equal to 25,000 poise when measured using a parallel plate melt rheology test at a heating rate of 10° C./min at a temperature of 350° C. to 450° C.

The composition can comprise: a flame retardant; a conversion material; and a polycarbonate, wherein the polycarbonate has a repeating structural background of the following formula

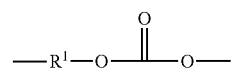

wherein greater than or equal to 60 percent of the total number of $R^1$ groups contain aromatic organic groups and the balance thereof are aliphatic, alicyclic, or aromatic groups and wherein the polycarbonate contains one or more bisphenols; wherein the polycarbonate comprises an end-capping agent; wherein the polycarbonate comprises a branching agent; and wherein the polycarbonate containing the branching agent and the end-capping agent has a peak melt viscosity of greater than or equal to 7,000 poise when calculated from the equation of wherein the peak melt viscosity equals: $-57135.91+36961.39*BL+14001.13*MW^{1/3}-46944.24*pKa-322.51*BL*MW^{1/3}-2669.19*BL*pKa+215.83*MW^{1/3}*pKa++1125.63*BL^2-200.11*MW^{2/3}+2231.15*pKa^2$, wherein BL is the mole ratio of the branching agent in the formulation determined by dividing the number of moles of branching agent by the total number of moles of bisphenol or bisphenols in the composition, the MW is the weight-averaged molecular weight of the polycarbonate containing the branching agent and the end-capping agent as determined by gel permeation chromatography using polycarbonate standards, and the pKa is the pKa of the end capping agent; and wherein a molded article of the composition has a UL 94 V0 rating at a thickness of 2.0 mm, specifically at 1.5 mm, and more specifically at 1.0 mm.

In a further embodiment, the peak melt viscosity is greater than or equal to 25,000 as calculated by the above equation.

In another embodiment, a method of making an article of manufacture that has a V0 94 rating at a thickness 1.5 mm comprises: (a) providing a polycarbonate, wherein the polycarbonate has a repeating structural background of the following formula

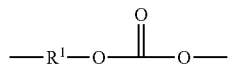

wherein greater than or equal to 60 percent of the total number of $R^1$ groups contain aromatic organic groups and the balance thereof are aliphatic, alicyclic, or aromatic groups and wherein the polycarbonate contains one or more bisphenols; an end capping agent that is not cyanophenol; a branching agent; (b) selecting the end-capping agent based upon the molecular weight of the polycarbonate and the branching level imparted by the branching agent, wherein the MVR of the polycarbonate is 1 to 15 cm$^3$/10 min and wherein the pKa of the end-capping agent is 8 to 11; (c) forming a polycarbonate containing the end-capping agent and the branching agent that has a peak melt viscosity that is greater than or equal to 7,000 poise when calculated from the equation of wherein the peak melt viscosity equals: $-57135.91+36961.39*BL+14001.13*MW^{1/3}-46944.24*pKa-322.51*BL*MW^{1/3}-2669.19*BL*pKa+215.83*MW^{1/3}*pKa+1125.63*BL^2-200.11*MW^{2/3}+2231.15*pKa^2$; and wherein BL is the mole ratio of the branching agent in the formulation determined by dividing the number of moles of branching agent by the total number of moles of bisphenol or bisphenols in the composition, the MW is the weight-averaged molecular weight of the formed polycarbonate as determined by gel permeation chromatography using polycarbonate standards, and the pKa is the pKa of the end capping agent; and (d) blending a flame retardant and a conversion material with the formed polycarbonate.

In a further embodiment, the peak melt viscosity is greater than or equal to 25,000 poise calculated from the above equation.

The polycarbonates herein include branched polycarbonate(s). Various types of branching agents can be utilized for the embodiments encompassed by this disclosure.

Branched polycarbonate blocks can be prepared by adding a branching agent during polymerization. These branching agents include polyfunctional organic compounds containing at least three functional groups selected from hydroxyl, carboxyl, carboxylic anhydride, haloformyl, and mixtures of the foregoing functional groups. Specific examples include trimellitic acid, trimellitic anhydride, trimellitic trichloride (TMTC), tris-p-hydroxy phenyl ethane (THPE), 3,3-bis-(4-hydroxyphenyl)-oxindole (also known as isatin-bis-phenol), tris-phenol TC (1,3,5-tris((p-hydroxyphenyl)isopropyl)benzene), tris-phenol PA (4(4(1,1-bis(p-hydroxyphenyl)-ethyl) alpha,alpha-dimethyl benzyl)phenol), 4-chloroformyl phthalic anhydride, trimesic acid, and benzophenone tetracarboxylic acid. The branching agents can be added at a level of 0.05 to 2.0 wt %. Mixtures comprising linear polycarbonates and branched polycarbonates can be used.

A particular type of branching agent can be used to create branched polycarbonate materials. These branched polycarbonate materials have statistically more than two end groups. The branching agent is added in an amount (relative to the bisphenol monomer) that is sufficient to achieve the desired branching content, that is, more than two end groups. The molecular weight of the polymer may become very high upon addition of the branching agent and may lead to viscosity problems during phosgenation. Therefore, in some embodiments, an increase in the amount of the chain termination agent is used in the polymerization. The amount of chain termination agent used when the particular branching agent is used is generally higher than the instance when only a chain termination agent is used. The amount of chain termination agent used is generally above 5 mole percent and less than 20 mole percent compared to the bisphenol monomer.

In some embodiments, the branching agent is a structure derived from a triacid trichloride of the formula (19):

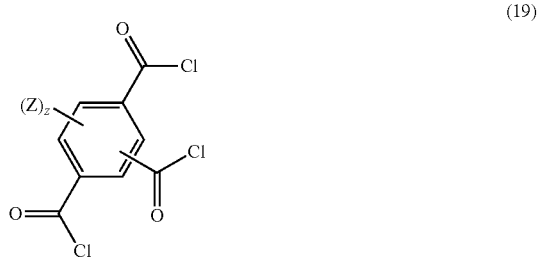

wherein, in this formula (19), Z is hydrogen, a halogen, $C_{1-3}$ alkyl group, $C_{1-3}$ alkoxy group, $C_{7-12}$ arylalkyl, alkylaryl, or nitro group, and z is 0 to 3; or a branching agent derived from a reaction with a tri-substituted phenol of the formula (20):

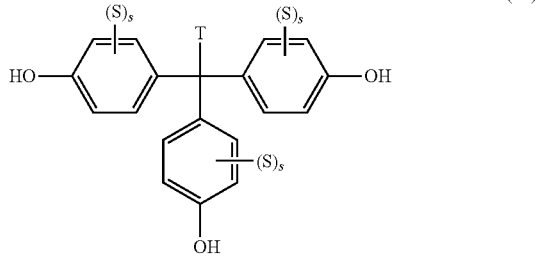

wherein, in this formula (20), T is a $C_{1-20}$ alkyl group, $C_{1-20}$ alkyleneoxy group, $C_{7-12}$ arylalkyl, or alkylaryl group, S is hydrogen, a halogen, $C_{1-3}$ alkyl group, $C_{1-3}$ alkoxy group, $C_{7-12}$ arylalkyl, alkylaryl, or nitro group, s is 0 to 4.

The branching agent can be a structure having formula (21):

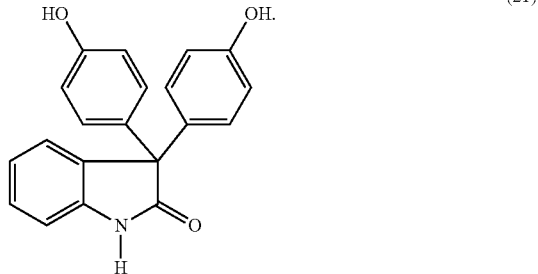

Examples of branching agents that are particularly effective in the compositions include trimellitic trichloride (TMTC), tris-p-hydroxy phenyl ethane (THPE) and isatinbis-phenol. In one embodiment, in formula (19), Z is hydrogen and z is 3. In another embodiment, in formula (20), S is hydrogen, T is methyl, and s is 4.

The relative amount of branching agents used in the manufacture of the polymer will depend on a number of considerations, for example the type of $R^1$ groups, the amount of cyanophenol, and the desired molecular weight of the polycarbonate. In general, the amount of branching agent is effective to provide about 0.1 to 10 branching units per 100 $R^1$ units, specifically about 0.5 to 8 branching units per 100 $R^1$ units, and more specifically about 0.75 to 5 branching units per 100 $R^1$ units. For branching agents having formula (20), the amount of branching agent tri-ester groups are present in an amount of about 0.1 to 10 branching units per 100 $R^1$ units, specifically about 0.5 to 8 branching units per 100 $R^1$ units, and more specifically about 0.75 to 5 tri-ester units per 100 $R^1$ units. For branching agents having formula (21), the amount of branching agent tricarbonate groups are present in an amount of about 0.1 to 10 branching units per 100 $R^1$ units, specifically about 0.5 to 8 branching units per 100 $R^1$ units, and more specifically about 0.75 to 5 triphenylcarbonate units per 100 $R^1$ units. In some embodiments, a combination of two or more branching agents may be used.

The polycarbonate of the composition can have a branching level of greater than or equal to 1%, specifically, greater than or equal to 2%, more specifically, greater than or equal to 3%, for example 1% to 3%.

Various types of end-capping agents can be utilized herein provided that such agents do not significantly adversely affect the desired properties of the compositions, such as transparency, ductility, fire retardants, and the like.

Examples of endcapping agents (also referred to as chain stoppers) include certain mono-phenolic compound(s), and/or mono-carboxylic acid chloride(s), and/or mono-chloroformate(s). Mono-phenolic chain stoppers are exemplified by monocyclic phenols such as phenol and $C_1$-$C_{22}$ alkyl-substituted phenols such as p-cumyl-phenol, and p-t-butyl phenol; and monoethers of diphenols, such as p-methoxyphenol, phenols with phenols with cyano-substitution such as p-cyanophenol, or with halogen substitution such as p-fluorophenol, or with nitro-substitution such as 4-nitrophenol. Alkyl-substituted phenols with branched chain alkyl substituents having 8 to 9 carbon atoms can be specifically mentioned. Certain mono-phenolic UV absorbers can also be used as an endcapping agent, for example 4-substituted-2-hydroxybenzophenones and their derivatives, aryl salicylates, monoesters of diphenols such as resorcinol monobenzoate, 2-(2-hydroxyaryl)-benzotriazoles and their derivatives, 2-(2-hydroxyaryl)-1,3,5-triazines and their derivatives, and the like. For example, the polycarbonate can have an end-cap comprising phenol, such as alkyl-substituted phenols, ether-substituted phenols, ester-substituted phenols, cyano-substituted phenols, and halogen substituted phenols, as well as combinations comprising at least one of the foregoing. Optionally, the end-capping agents can be selected from: cyanophenol and a phenol containing substitution(s) with aliphatic groups, olefinic groups, aromatic groups, halogens, ester groups, ether groups, and combinations comprising at least one of the foregoing.

Of particular usefulness commercially, the end-capping agents can be phenol, e.g., specifically, can be selected from: cyanophenol, para-t-butylphenol, para-cumylphenol, and combinations comprising at least one of the foregoing.

Various types of conversion material(s) can be utilized in conjunction with a polymer (e.g., polycarbonate) containing composition described in this disclosure. Conversion material(s) are selected and added in an effective quantity so as to facilitate luminescence or transmission of a LED or other light-emitting device. The useful conversion material(s) have a shortlived luminescence lifetime of less than $10^{-4}$ seconds. It is noted that, depending upon how a conversion material is made, it may be longlived (luminescence lifetime of greater than minutes) or shortlived.

The conversion material(s) can be coated (e.g., result of applying a material to the surface of the conversion material(s), wherein the coating is on the surface and/or chemically interacts with the surface). Radiometric values (such as radiant power, radiant intensity, irradiance, and radiance) and corresponding photometric values (such as total luminance flux, luminous intensity, illuminance, luminance), luminance efficacy (in lumens per watt (lm/W)), color rendering index, color quality scale (CQS), correlated color temperature, and chromaticity, are expected to improve compared to the uncoated conversion material(s) when added to a polymer material such as polycarbonate. Desirably, the conversion material(s) are sufficiently coated so as to maintain melt stability with an MVR change of less than or equal to 30%, specifically less than or equal to 10% (i.e., MVR is determined at 6 minutes and again at 18 minutes, and the difference between these MVRs is less than or equal to 30% of the 6 minute value).

The conversion material(s) can be coated with silicone oil(s) and/or a layer of amorphous silica. Some examples of silicone oils include, but are not limited to: hydrogen-alkyl siloxane oil; polydialkyl siloxance oil; polydimethyl siloxane codiphenyl siloxane, dihydroxy terminated (such as Gelest PDS 1615 commercially available from Gelest, Inc.); as well as combinations comprising at least one of the foregoing. Such silicone oils are considered coatings where the conversion material is first treated with the silicone oil(s) prior to addition to a matrix or binder (collectively referred to as matrix), such as polycarbonate. The coating itself, is neither the binder nor the matrix that contains the conversion material to hold in place for exposure to blue LED radiation. Additionally, the coating does not require a curing method.

The conversion material can be coated with silicone oil e.g., by a method such as spraying the silicon oil. For example, the conversion material can be coated by spraying of the silicone oil in a fluidized bed reactor. The total amount of silicone oil can be 0.05 weight percent (wt %) to 20 wt % with respect to the conversion material, specifically, 0.1 wt % to 10 wt %, and more specifically, 0.5 wt % to 5 wt %, based upon the total weight of the conversion material. When two silicone coatings are used, such as polymethylhydrosiloxane and polydimethylsiloxane, the total amount does not change, and the split ratio between the two oils can be 1:99 to 99:1 depending on the type of protection being sought. In an embodiment, the first coating represents at least about 50 wt % of the total silicone oil content. Coating of conversion materials is further described in commonly assigned U.S. Pat. No. 6,692,659 B2 to Brown et al.

Some examples of oils include polymethylhydrosiloxane (for example, DF1040 commercially available from Momentive Performance Materials) and polydimethyl siloxane (e.g., DF581 commercially available from Momentive Performance Materials). Other examples include diphenyl siloxane, e.g., silanol terminated oils such as silanol terminated diphenylsiloxane (e.g., PDS-1615 commercially available from Gelest, Inc., Morrisville, Pa.). Loading level up to 4 pph by weight, specifically a loading of 0.1 to 0.5 (e.g., 0.2) pph by weight of pigment (e.g., Gelest PDS-1615). Other possible silanol terminated siloxanes include PDS-0338 and PDS-9931 also commercially available from Gelest, Inc. Desirably, the final article comprising the coated conversion material(s) comprises less than or equal to 20 pbw of coated conversion material(s) to 100 pbw of polymer material.

The conversion material(s), including those of which are surface treated, include: conversion material(s) having formula:

$$(A^3)_2SiO_4:Eu^{2+}D^1$$

where $A^3$ is a divalent metal selected from Sr, Ca, Ba, Mg, Zn, Cd, and combinations comprising at least one of the foregoing, and $D^1$ is a dopant selected from F, Cl, Br, I, P, S or N, and optionally combinations comprising at least one of the foregoing.

The conversion material(s) can be material(s) having formula: $(A^4)_2SiO_4:Eu^{2+}D^2$ with an optional dopant selected from Al, Co, Fe, Mg, Mo, Na, Ni, Pd, P, Rh, Sb, Ti or Zr, and optionally combinations comprising at least one of the foregoing, wherein $A^4$ is selected from Sr, Ba, Ca, and combinations comprising at least one of the foregoing.

The conversion material(s) can be material(s) having formula:

$$(YA^5)_3(AlB)_5(OD^3)_{12}:Ce^{3+} \qquad (25)$$

where $A^5$ is a trivalent metal selected from Gd, Tb, La, Sm, or a divalent metal ion such as Sr, Ca, Ba, Mg, Zn, Cd, and combinations comprising at least one of the foregoing; B is selected from Si, B, P, and Ga, and optionally combinations comprising at least one of the foregoing; and $D^3$ is a dopant selected from F, Cl, Br, I, P, S or N, and optionally combinations comprising at least one of the foregoing. Other possible yellow conversion material(s) include: $Y_3Al_5O_{12}$:Ce; $Tb_{3-x}RE_xAl_5O_{12}$:Ce (TAG), wherein RE=Y, Gd, La, Lu; $Sr_{2-x-y}Ba_xCa_ySiO_4$:Eu; $Sr_{3-x}SiO_5:Eu^{2+}_x$, wherein $0<x\le 1$. Possible yellow/green conversion material(s) include: (Sr,Ca,Ba)(Al,Ga)$_2S_4:Eu^{2+}$; $Ba_2(Mg,Zn)Si_2O_7:Eu^{2+}$; $Gd_{0.46}Sr_{0.31}Al_{1.23}O_xF_{1.38}Eu^{2+}_{0.06}$; $(Ba_{1-x-y}Sr_xCa_y)SiO_4$:Eu; and $Ba_2SiO_4:Eu^{2+}$.

The conversion material(s) can be a material having the following formula: $(YGd)_3Al_5O_{12}:Ce^{3+}$ or $Y_3Al_5(OD^3)_{12}:Ce^{3+}$.

The conversion material(s) can be orange-red silicate-based conversion material(s) having formula:

$$(SrM1)_3Si(OD^4)_5:Eu$$

where M1 is selected from Ba, Ca, Mg, Zn, and combinations comprising at least one of the foregoing; and $D^4$ is selected from F, Cl, S, and N, and optionally combinations comprising at least one of the foregoing; conversion material(s); a $Eu^{2+}$ doped and or $Dy^{3+}$ conversion material(s) having formula:

$$M_3MgSi_2O_8$$

wherein M is selected from Ca, Sr, Ba and combinations comprising at least one of the foregoing.

The conversion material(s) can be red silicon nitride based $Eu^{2+}$ doped conversion material(s) having a formula:

$$(SrM2)_2Si_5N_8$$

where M2 is selected from Ca, Mg, and Zn. Other nitridosilicates, oxonitridosilicates, oxonitridoaluminosilicates examples include:

$Ba_2SiN_8:Eu^{2+}$ alpha-SiAlON:Re (Re=$Eu^{2+}$, $Ce^{3+}$, $Yb^{2+}$, $Tb^{3+}$, $Pr^{3+}$, $Sm^{3+}$, and optionally combinations comprising at least one of the foregoing.

Beta-SiAlON:$Eu^{2+}$ $Sr_2Si_5N_8:Eu^{2+},Ce^{3+}$

Rare earth doped red sulfate based conversion material(s), e.g., have the formula:

$$(SrM3)S$$

where M3 is selected from Ca, Ba, and Mg, and optionally combinations comprising at least one of the foregoing. Other possible red conversion material(s) include $Sr_xCa_{1-x}S$:Eu,Y, wherein Y is a halide; $CaSiAlN_3:Eu^{2+}$; $Sr_{2-y}Ca_ySiO_4$:Eu; $Lu_2O_3:Eu^{3+}$; $(Sr_{2-x}La_x)(Ce_{1-x}Eu_x)O_4$; $Sr_2Ce_{1-x}Eu_xO_4$; $Sr_{2-x}Eu_xCeO_4$; $SrTiO_3:Pr^{3+},Ga^{3+}$; $CaAlSiN_3:Eu^{2+}$; and $Sr_2Si_5N_8:Eu^{2+}$.

The conversion material(s) can comprise blue conversion material(s), e.g., having the formula $BaMgAl_{10}O_{17}:Eu^{2+}$.

The conversion material(s) can comprise green sulfate based conversion material(s), e.g., having formula:

$$(SrM3)(GaM4)_2S_4:Eu$$

where M3 is set forth above, and M4 is selected from Al and In.

The conversion material(s) can include $Tb_{3-x}RE^1_x(O_{12})$:Ce(TAG), wherein $RE^1$ is selected from Y, Gd, La, Lu, and combinations comprising at least one of the foregoing; yttrium aluminum garnet (YAG) doped with cerium (e.g., $(Y,Gd)_3Al_5O_{12}:Ce^{3+}$; YAG:Ce); terbium aluminum garnet doped with cerium (TAG:Ce); silicate conversion material(s) (BOSE), (e.g. $(Sr)_2SiO_4$:Eu, $(Ba)_2SiO_4$:Eu, $(Ca)_2SiO_4$:Eu); nitride conversion material(s) (e.g., doped with cerium and/or europium); nitrido silicates (e.g., $LaSi_3N_5:Eu^{2+}$, $O^{2-}$ or $Ba_2Si_5N_8:Eu^{2+}$); nitride orthosilicate (e.g., such as disclosed in DE 10 2006 016 548 A1); or combinations comprising at least one of the foregoing. Other possible green conversion material(s) include: $SrGa_2S_4$:Eu, $Sr_{2-y}BaySiO_4$:Eu, $SrSiO_2N_2$:Eu, and $Ca_3Si_2O_4N_2:Eu^{2+}$ The various coated conversion material(s) described above can be used alone or in combination. The conversion material(s) can comprise combinations of coated yellow conversion material(s) (such as $(Y,Gd)_3Al_5O_{12}$:Ce3+ or $(Sr,Ba,Ca)_2SiO_4$:Eu) with a coated red conversion material(s) (such as $(Sr,Ca)AlSiN_3$:Eu), e.g., to produce a warm white light. The conversion material(s) comprise combinations of coated green aluminate (GAL) and a coated red conversion material(s) (e.g., to produce white light from the RGB of blue led, green light and red light). Coated green aluminate and red nitride conversion material(s) can be used alone or combined to generate white light when exposed to blue LED light. Coated red nitride conversion material(s) may contain ions to promote quantum efficiency. The conversion material(s) can comprise a combination of a semiconductor nanocrystals of cadmium sulfide mixed with manganese; and/or a $La_3Si_6N_{11}:Ce^{3+}$. A coated YAG:Ce conversion material or coated BOSE (boron ortho-silicate) conversion material, for example, can be utilized to convert the blue light to yellow. A reddish AlInGaP LED can be included to pull yellow light from the conversion material to the black body curve.

Also included are combinations comprising at least one of the foregoing conversion materials.

The coated YAG:Ce based conversion material(s) can be synthetic aluminum garnets, with garnet structure $A_3^{3+}B_5^{3+}O_{12}^{2-}$ (containing $Al_5O_{12}^{9-}$ and A is a trivalent element such as $Y^{3+}$). Specifically, in some embodiments, the coated conversion material(s) is not an aluminum spinel, wherein a spinel has the structure $A^{2+}B_2^{3+}O_4^{2-}$ ($Al_2O_4^{2-}$ and A is a divalent alkaline earth element such as $Ca^{2+}$, $Sr^{2+}$, and $Ba^{2+}$). The aluminum garnet is synthetically prepared in such a manner (annealing) as to impart short-lived luminescence lifetime lasting less than $10^{-4}$ s. Another process for forming short-lived luminescence (i.e., avoiding forming long afterglow materials) is disclosed in *Advanced Powder Technology* to Shii Choua et al., Volume 23, Issue 1, January 2012, Pages 97-103.

The amount of coated conversion material(s) added to a polymer material to form the polymer composition may vary according to the selected polymer composition and/or the surface coating for the selected conversion material(s). The coated conversion material(s) can be added to the polymer material in an amount of 0.1 to 40 parts by weight (pbw) of coated conversion material based on 100 pbw of polymer material, specifically, 4 to 20 pbw of coated conversion material(s) to 100 pbw of polymer material.

The conversion material(s) can have a median particle size of 10 nanometers (nm) to 100 micrometers (μm), as determined by laser diffraction. The median particle size is sometimes indicated as $D_{50}$-value. The median particle size can be 1 to 30 micrometers, specifically, 5 to 25 micrometers. Examples of median particle sizes include 1 to 5 micrometers, 6 to 10 micrometers, 11 to 15 micrometers, 16 to 20 micrometers, 21 to 25 micrometers, 26 to 30 micrometers, or 31 to 100 micrometers, or larger.

The polymer composition comprising coated conversion material(s) can take many different shapes. For example, the polymer composition comprising the coated conversion material(s) can have more or fewer bends such that it is U-shaped or V-shaped, or can have different bends with different radii of curvature. There can be multiple bends in different locations and different embodiments the polymer composition comprising the coated conversion material(s) can take more complex compound shapes. The polymer composition comprising the coated conversion material(s) can be rounded or polygonal, for example, the shape can be circular, oval, rectangular, square, pentagon, hexagon, octagon, etc., and/or it can have a more complex shape such as those illustrated in U.S. Patent Publication No. 2011/0140593 to Negley et al. Examples of some more complex shapes include hyperbolic paraboloid shapes, such as doubly ruled surface shaped like a saddle. Desirably, the radius of curvature for the different sections is such that there are no facing surfaces or the number of facing surfaces is minimizes. The shape is generally open when viewed from the top. It is understood that the polymer composition comprising the coated conversion material(s) can take many different compound shapes beyond those described above. For example, a generally open shape comprising multiple edges and surfaces with different radii of curvature.

A silicone-coated conversion material(s) in polycarbonate is expected to maintain melt stability with an MVR change of less than or equal to 10% (i.e., MVR is determined at 6 minutes and again at 18 minutes, and the difference between these MVRs is less than or equal to 10% of the 6 minute value).

When testing the 6 minutes (min) MVR of a polymer composition (coated conversion material(s) in a polymer material (e.g., polycarbonate (PC)) sample and comparing to the 6 min MVR of the polymer material (e.g., the same polymer material without the coated conversion material)), the addition of the coated conversion material(s) to the plastic should change the 6 min MVR by less than or equal to 30%, specifically, less than or equal to 15%, and more specifically less than or equal to 5%. Similarly, the MVR of the 18 min dwell of the coated conversion material(s) plastic sample compared to the polymer material, should change by less than or equal to 30%, specifically less than or equal to 10%, and more specifically, less than or equal to 5%. It is also desirable to have a MVR change from the 6 min MVR of the coated conversion material(s) containing sample compared to the 18 min MVR for the same sample of less than or equal to 20%, specifically, less than or equal to 10%, and more specifically, less than or equal to 5%.

Notched Izod impact (% ductility) at 3.2 mm as determined according to ASTM D256-10 at room temperature (RT) of 23° C. and low temperature (e.g., 0° C.) can be greater than or equal to 80%, specifically, greater than or equal to 90%, and more specifically, 100%.

Lightness (L*) is expected to be greater as well as measured by CIELAB (Reflectance, with a D65 illuminant, and a 10 degree observer). Coated conversion materials will not scrub the inside of the extruder or injection molding machine. Scrubbing leads to graying of the resin and/or the final part. Any unintended color shift either due to resin yellowing or graying will lead to undesirable effects on the total luminous flux and chromaticity across the lifetime of a solid state lighting device. It is desirable to prevent the solid state lighting device from emitting different amounts of light and different colors through its life.

A stable resin system should enable higher reliability where the luminous flux and color coordinates shift is minor and allows greater lumen maintenance. Lumen maintenance may be evaluated according to IES LM-80-08 method, IES TM-21, IESNA methods or any other type of method used to determine lifetime of a solid state lighting product, but not limited to these methods.

A coated YAG:Ce conversion material or coated BOSE (boron ortho-silicate) conversion material, for example, can be utilized to convert the blue light to yellow. A reddish AlInGaP LED can be included to pull yellow light from the coated conversion material to the black body curve. The coated conversion material can be arranged so that none or a minimal amount of heat from the LEDs passes into the conversion material to avoid heat degradation. The polymer composition can also be shaped to provide a uniform distribution of light from the lamp while minimizing absorption of re-emitted light. In one embodiment, the coated conversion material comprises YAG:Ce conversion material or BOSE conversion material and a red conversion material so that the lamp emits the desired CRI and color temperature.

The polymer composition can also have different characteristics to provide the desired emission pattern from the lamp. In some embodiments, the coated conversion material layer can have regions with different thickness, with the sections of greater thickness presenting more coated conversion material for the light to pass through. In other embodiments the article (e.g., housing) formed from the composition can have different concentrations of coated conversion materials in different regions. In other embodiments, the polymer composition can also have more than one coated conversion material mixed throughout, or can have different regions of different coated conversion materials. The coated conversion material can also have dispersing agents arranged throughout, or dispersing agents arranged in different concentrations in different regions. The polymer composition can also have regions that are substantially transparent.

The polymer (e.g., thermoplastic) composition can include various additive(s) ordinarily incorporated in polycarbonate compositions of this type, with the proviso that the additives are selected so as to not significantly adversely affect the desired properties of the polycarbonate, for example, impact, viscosity, and flame retardance. Combinations of additives can be used. Such additives can be mixed at a suitable time during the mixing of the components for forming the composition.

The additive(s) can be selected from at least one of the following: UV stabilizing additives, impact modifiers, thermal stabilizing additives, flame retarding agents, mold release agents, colorants, melt stabilizers, scattering agents (such as titanium dioxide), organic and inorganic fillers, interference particles, color absorbing particles, gamma-stabilizing agents, and scattering particles, and/or diffusers (e.g., Tospearl 120 (also known as TSR9004 commercially available from Momentive Performance Materials), acrylic particles, and so forth). Epoxies, such as Joncryl™ commercially available from BASF, for example could be added for melt stability.

For example, scattering particles, e.g., in a concentration of greater than 0 to 1 pbw, specifically, 0.001 pbw to 0.3 pbw, more specifically, 0.01 pbw to 0.2 pbw, based upon 100 pbw of polymer material. For some scattering particles there can be an increase in transmittance loss due to light absorption for higher concentrations. Thus, the concentrations of the scattering particles should be chosen in order to maintain an acceptable light absorption loss. The scattering particles can comprise many different materials including but not limited to: silica gel, zinc oxide (ZnO), yttrium oxide ($Y_2O_3$), titanium dioxide ($TiO_2$), barium sulfate ($BaSO_4$), alumina ($Al_2O_3$), fused silica ($SiO_2$), fumed silica ($SiO_2$), aluminum nitride, glass beads, zirconium dioxide ($ZrO_2$), silicon carbide (SiC), tantalum oxide ($TaO_5$), silicon nitride ($Si_3N_4$), niobium oxide ($Nb_2O_5$), boron nitride (BN), conversion material particles (e.g., YAG:Ce, BOSE), as well as combinations comprising at least one of the foregoing.

Polymer compositions (e.g., polycarbonate) can be manufactured by various methods. For example, a blend of various polymer compositions, e.g. polycarbonate can be fed into the throat of a single or twin-screw extruder via a hopper. Care must be taken so as to not effectuate shear of the coated conversion material and should limit pressure applied to conversion materials and/polycarbonate material so as to not affect its desired properties.

The final coated conversion material can be used in polymer material(s) (e.g., polycarbonate or any other thermoplastic resin formulation). During the polymer material's extrusion process, the coated conversion material(s) can be added upstream or downstream using a side feeder. The coated conversion material(s) can be added to the melt alone. Optionally, the coated conversion material(s) can also be added directly to a blender and mixed with resin powder. The advantage of the coated conversion material(s) in this case is the reduction of the contacts between the abrasive conversion material(s) and the walls or the mixing elements, which reduces the graying issues in the final product and therefore leads to greater luminous flux and color quality in a solid state lighting device that produces white light.

The coated conversion material can first be compounded into polycarbonate with an appropriate heat stabilizer on a single screw or twin screw extruder in order to wet the surface for production (e.g., a master batch production). Multiple passes through an extruder may be necessary to fully wet the coated conversion material surface. Such master batches can then be added downstream or at the throat on a dedicated feeder(s) for accurate addition the final polymer formulation in an extruder. When added to the final polymer formulation, only mild distributive mixing is then used to fully disperse the coated conversion material(s) into the formulation. Examples of processing are further described in commonly assigned U.S. Pat. No. 6,692,659 B2 to Brown et al.

Shaped, formed, or molded articles comprising the plastic (e.g., thermoplastic) compositions are also provided. The polymer compositions can be formed into useful shaped articles by a variety of means such as injection molding, extrusion (e.g., film/sheet extrusion), rotational molding, blow molding, and thermoforming.

In one embodiment, the polymer composition or polycarbonate containing compositions and the coated conversion material can be employed in a lighting type application, e.g., as a housing for a LED light.

In a further embodiment, the LEDs in a housing formed from the polymer composition can be employed in aviation lighting, automotive lighting, (e.g., brake lamps, turn signals, headlamps, cabin lighting, and indicators), traffic signals, text and video displays and sensors, a backlight of the liquid crystal display device, control units of various products (e.g., for televisions, DVD players, radios, and other domestic appliances), and a dimmable solid state lighting device.

An article (e.g., illumination device such as a light, luminaire, signal, and so forth) can comprise a semiconductor light-emitting element, which emits light (e.g., having a peak wavelength of 370 nm to 470 nm); and a light-emitting portion comprising the composition, wherein the light-emitting portion is excited by the light emitted from the semiconductor light-emitting element to emit light.

A lighting arrangement can comprise: a radiation source configured to emit radiation having a first wavelength range; a coated conversion material configured to absorb at least a portion of said first wavelength range radiation and emit radiation having a second wavelength range; and an optical component through which at least said first wavelength range radiation passes, wherein the coated conversion material contained with/dispersed in the optical component.

In a further embodiment, the conversion material is surface coated.

In a further embodiment, the conversion material is coated with one or more surface coatings described in this disclosure.

In a further embodiment, the lighting arrangement can further comprise a radiation source, e.g., a light emitting diode (LED) or a light pipe. For example, the lighting arrangement can comprise a LED chip comprising a gallium nitride LED.

Optionally, the radiation source can be operable to emit radiation having a wavelength of 300 nanometers (nm) to 500 nm.

The conversion material can optionally be configured to emit radiation having a wavelength of 450 nm to 700 nm. Desirably, the conversion material emits at a different wavelength than the radiation source.

The lighting arrangement can comprise an optical component (e.g., a lens) having a surface that can be convex, concave, hemispherical, spherical, hollow cylinder, a paraboloid, and planar, as well as combinations comprising at least one of the foregoing. In the various embodiments, the coated conversion material(s) can be within the surface, e.g., can be mixed within the composition that forms the optical component. Optionally, a light diffusing material can be incorporated with the polymer composition. Examples of diffusing materials include: crosslinked polymethylmethacrylate (PMMA), polytetrafluoroethylene (Teflon), and methylsesquioxane (e.g., Tospearl™ 120 or TSR9004). The housing can be transparent to light from the light source and the coated conversion material, or can comprise a diffusing particle or a diffusing surface to help mix the light as it passes through the housing. Optionally, portions of the housing can be diffusive, while other portions can be transparent or clear.

In an embodiment, an optical component can be for a lighting arrangement of a type comprising a radiation source configured to emit radiation having a first wavelength range. The optical component can comprise a plastic and (e.g., throughout the optical component) a coated conversion material configured to absorb at least a portion of said first wavelength range radiation and emit radiation having a second wavelength range; and said optical component being configured such that at least said first wavelength range radiation passes though the optical component. The radiation source can be a LED (e.g., light emitting diode (LED) chip or die, light emitting polymers (LEPs), polymer light emitting diodes (PLEDs), organic light emitting diodes (OLEDs), or the like) is a solid-state semiconductor device, which can convert electricity directly into to light. For example, LED comprises a semiconductor chip, one side of the chip is attached to a stent, the end is negative ("n"), the other side connects to the positive ("p") terminal of the power. The whole chip can optionally be packaged (e.g., coated, encapsulated, and so forth). LEDs, e.g., in the form of an array, can be fashioned on a base (substrate or "PCB" printed circuit board) in thermal communication with a heat sink.

In other words, the semiconductor chip has two parts, one is p-type semiconductor and the other part is the n-type semiconductor. A p-n junction is formed between them when the two semiconductors are connected. An electrical path for supplying control signals to the LEDs can be provided through conductors. The conductors are electrical elements (e.g., strips) applied to a surface of an insulative layer. The insulative layer is mounted to a heat sink. The insulative layer can be a circuit board. The conductor may be any suitable electrically conductive material. Examples of electrically conductive materials include copper, aluminum, or the like, and combinations comprising at least one of the foregoing.

The current acting on the chip causes the emission of energy (e.g., in the form of photons). The wavelength of the light or the color is determined by the material of p-n junction.

Embodiment 1: a light emitting device comprises: a lighting element located in a housing, wherein the housing is formed from a polymer composition comprising: a polymer material; and a coated conversion material. The conversion material comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials. After the conversion material has been exposed to an excitation source, the conversion material has a luminescence lifetime of less than $10^{-4}$ seconds when the excitation source is removed.

Embodiment 2: a plastic molded device has a transparency of greater than or equal to 30%, wherein the article is formed from the polymer composition. The polymer composition comprises a polymer material and a coated conversion material. The conversion material comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials. After the conversion material has been exposed to an excitation source, the conversion material has a luminescence lifetime of less than $10^{-4}$ seconds when the excitation source is removed.

Embodiment 3: a light emitting device comprises: a radiation source and an emitting portion in optical communication with the radiation source, wherein the emitting portion is formed from a polymer composition. The polymer composition comprises a polymer material and a coated conversion material. The conversion material comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials. After the conversion material has been exposed to an excitation source, the conversion material has a luminescence lifetime of less than $10^{-4}$ seconds when the excitation source is removed.

Embodiment 4: a lighting device comprises: a radiation source configured to emit radiation having a first wavelength range and an optical component comprising a polymer composition. The polymer composition comprises a polymer material and a coated conversion material. The conversion material comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials. After the conversion material has been exposed to an excitation source, the conversion material has a luminescence lifetime of less than $10^{-4}$ seconds when the excitation source is removed. The conversion material is configured to absorb at least a portion of the first wavelength range radiation and emit radiation having a second wavelength range; wherein the optical component is configured such that at least the first wavelength range radiation passes though the optical component.

Embodiment 5: a light-emitting device comprises: a means for emitting radiation having a first wavelength range, wherein the means for emitting radiation is located in a housing formed from a polymer composition. The polymer composition comprises: a polymer material, and means for absorbing at least a portion of the first wavelength range radiation and emitting radiation having a second wavelength range. After the means for absorbing has been exposed to the radiation, the means for absorbing has a luminescence lifetime of less than $10^{-4}$ seconds when the radiation exposure stops. The means for absorbing comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials.

Embodiment 6: comprises the use of a polymer composition as a housing for a light emitting element. The polymer composition comprises a polymer material and a conversion material. The conversion material comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials. After the conversion material has been exposed to an excitation source, the conversion material has a luminescence lifetime of less than $10^{-4}$ seconds when the excitation source is removed.

Embodiment 7: a light-emitting device containing a light diffusing thermoplastic composition comprising a thermoplastic polymer, and "a" is 0.001 to 2 wt % of an inorganic particle having an average particle diameter of 0.1 to 1 micrometers and a refractive index of 1.9 to 3.2; "b" is 0.01 to 10 wt % of a polymeric particle as described in Claims 1-72 having an average particle size in the range if from 0.2 to 20 microns that differs in refractive index at 589 nm by at least 0.05 from that of the thermoplastic resin polymer and one or mixtures of "c", "d", or a mixture thereof wherein "c" is 0.1 to 1,000 ppm of wavelength downshifting material, and "d" is 0.005 to 2 weight percent of an interference pigment.

Embodiment 8: a light emitting device comprises: a lighting element located in a housing, wherein the housing is formed from a polymer composition comprising: a polymer material; and a coated conversion material. The conversion material comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials. After the conversion material has been exposed to an excitation source, the conversion material has a luminescence lifetime of less than $10^{-4}$ seconds when the excitation source is removed.

Embodiment 9: a plastic molded device has a transparency of greater than or equal to 30%, wherein the article is formed from the polymer composition. The polymer composition comprises a polymer material and a coated conversion material. The conversion material comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials. After the conversion material has been exposed to an excitation source, the conversion material has a luminescence lifetime of less than $10^{-4}$ seconds when the excitation source is removed.

Embodiment 10: a light emitting device comprises: a radiation source and an emitting portion in optical communication with the radiation source, wherein the emitting portion is formed from a polymer composition. The polymer composition comprises a polymer material and a coated conversion material. The conversion material comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials. After the conversion material has been exposed to an excitation source, the conversion material has a luminescence lifetime of less than $10^{-4}$ seconds when the excitation source is removed.

Embodiment 11: a lighting device comprises: a radiation source configured to emit radiation having a first wavelength range and an optical component comprising a polymer composition. The polymer composition comprises a polymer material and a coated conversion material. The conversion material comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials. After the conversion material has been exposed to an excitation source, the conversion material has a luminescence lifetime of less than $10^{-4}$ seconds when the excitation source is removed. The conversion material is configured to absorb at least a portion of the first wavelength range radiation and emit radiation having a second wavelength range; wherein the optical component is configured such that at least the first wavelength range radiation passes though the optical component.

Embodiment 12: a lighting device comprises: a radiation source configured to emit radiation having a first wavelength range; an optical component comprising the polymer composition. The polymer composition comprises: a polymer material and a coated conversion material. The conversion material comprises greater than 0 ppm of a first material selected from Si, Sr, Ba, Ca, Eu, and combinations comprising at least one of the foregoing first materials; and less than 50 ppm of a second material selected from Al, Co, Fe, Mg, Mo, Na, Ni, Pd, P, Rh, Sb, Ti, Zr, and combinations comprising at least one of the foregoing second materials. After the conversion material has been exposed to an excitation source, the conversion material has a luminescence lifetime of less than $10^{-4}$ seconds when the excitation source is removed.

Embodiment 13: a lighting device, comprises a radiation source configured to emit radiation having a first wavelength range; an optical component comprising the polymer composition. The polymer composition comprises: a polymer material and a coated conversion material, coated yttrium aluminum garnet (YAG) doped with rare earth elements, coated terbium aluminum garnet doped with rare earth elements; coated nitrido silicates doped with rare earth elements; coated nitride orthosilicate doped with rare earth elements, coated oxonitridoaluminosilicates doped with rare earth elements; as well as combinations comprising at least one of the foregoing. After the coated conversion material has been exposed to an excitation source, the coated conversion material has a luminescence lifetime of less than $10^{-4}$ seconds when the excitation source is removed.

In the various Embodiments 1-13: (i) the conversion material is coated with be 0.05 wt % to 20 wt % silicone oil based upon the weight of the coated conversion material; and/or (ii) the polymer composition comprises 0.1 to 40 pbw of the coated conversion material based on 100 pbw of polymer material; and/or (iii) the polymer composition comprises 4 to 20 pbw of the coated conversion material based on 100 pbw of polymer material; and/or (iv) wherein the polymer composition has a 6 min MVR that is less than or equal to 30% greater than a polymer material 6 min MVR; and/or (v) wherein the polymer composition has a 6 min MVR that is less than or equal to 15% greater than a polymer material 6 min MVR; and/or (vi) wherein the polymer composition has a 6 min MVR that is less than or equal to 5% greater than a polymer material 6 min MVR; and/or (vii) wherein the polymer composition further comprises greater than 0 to 1 pbw particles, based upon 100 pbw of polymer material, wherein the particles are selected from at least one of the following scattering particles, interference particles, and color absorbing particles; and/or (viii) the polymer composition comprises 0.001 pbw to 0.3 pbw scattering particles, based upon 100 pbw of polymer material; and/or (ix) the coated conversion material comprises a luminescent material having formula: $(A^3)_2SiO_4:Eu^{2+}D^1$, wherein $A^3$ is a divalent metal selected from Sr, Ca, Ba, Mg, Zn, and Cd, and combinations comprising at least one of the foregoing; and $D^1$ is a dopant selected from F, Cl, Br, I, P, S and N, and combinations comprising at least one of the foregoing;

and/or (x) the coated conversion material comprises a luminescent material having formula: $(YA^5)_3(A1B^1)_5(OD^3)_{12}$:$Ce^{3+}$, where $A^5$ is a trivalent metal selected from Gd, Tb, La, Sm, or a divalent metal ion selected from Sr, Ca, Ba, Mg, Zn and Cd, and combinations comprising at least one of the foregoing; $B^1$ is selected from Si, B, P, and Ga, and combinations comprising at least one of the foregoing; and $D^3$ is a dopant selected from F, Cl, Br, I, P, S, and N, and combinations comprising at least one of the foregoing; and/or (xi) the coated conversion material comprises an orange-red silicate-based conversion material having formula: $(SrM1)_3Si(OD^4)_5$:Eu, wherein M1 is selected from Ba, Ca, Mg, and Zn, and combinations comprising at least one of the foregoing; and $D^4$ is selected from F, Cl, S, and N, and combinations comprising at least one of the foregoing; and/or (xii) the coated conversion material comprises an $Eu^{2+}$ and/or $Dy^{3+}$ doped conversion material having formula: $M3MgSi_2O_8$, wherein M is selected from Ca, Sr, or Ba, and combinations comprising at least one of the foregoing; and/or (xiii) he conversion material comprises a rare earth doped a red silicon nitride based conversion material having a formula: $(SrM2)_2Si_5N_8$, wherein M2 is selected from Sr, Ca, Mg, and Zn, and combinations comprising at least one of the foregoing; and/or (xiv) the coated conversion material comprises a rare earth doped a red sulfate based conversion material having formula: (SrM3)S, wherein M3 is selected from Ca, Ba, and Mg, and combinations comprising at least one of the foregoing; and/or (xv) the coated conversion material is a green sulfate based conversion material having formula: $(SrM3)(GaM4)_2S_4$:Eu, wherein M3 is Ca, Ba, and Mg, and combinations comprising at least one of the foregoing; and M4 is selected from Al and In, and combinations comprising at least one of the foregoing; and/or (xvi) the coated conversion material is selected from a strontium silicate yellow conversion material; yttrium aluminum garnet doped with rare earth element; terbium aluminum garnet doped with a rare earth element; silicate conversion materials; nitride conversion materials; nitrido silicates; nitride orthosilicate; oxonitridoaluminosilicates; and combinations comprising at least one of the foregoing; and/or (xvii) the coated conversion material is a selected from combinations of coated yellow conversion material with a coated red conversion material; combinations of coated green and coated red conversion material; a semiconductor nanocrystals of cadmium sulfide mixed with manganese; and combinations comprising at least one of the foregoing; and/or (xviii) the coated conversion material comprises a silicone oil coating; and/or (xix) the silicone oil is selected from hydrogen-alkyl siloxane oil; polydialkyl siloxance oil; polydimethyl siloxane codiphenyl siloxane, dihydroxy terminated, and combinations comprising at least one of the foregoing; and/or (xx) the coated conversion material comprises an amorphous silica coating; and/or (xxi) the polymer material is selected from a polycarbonate, polyethylene terephthalate, polybutylene terephthalate, polymethyl methacrylate, polyamide, and combinations comprising at least one of the foregoing; and/or (xxii) the polymer material comprises polycarbonate having a repeating structural background of the following formula; and/or (xxiii) greater than or equal to 60 percent of the total number of R1 groups contain aromatic organic groups and the balance thereof are aliphatic, alicyclic, or aromatic groups; and/or (xxiv) the polymer material comprises polycarbonate; and/or (xxv) the polymer material comprises polycarbonate having a glass transition temperature of greater than 170° C. as measured using a differential scanning calorimetry method, wherein the polycarbonate is derived from: a monomer having the structure: (a) a monomer having the structure $$HO\text{-}A_1\text{-}Y_1\text{-}A_2\text{-}OH$$

wherein each of $A_1$ and $A_2$ comprise a monocyclic divalent arylene group, and $Y_1$ is a bridging group; or (b) polyester monomer units having the structure

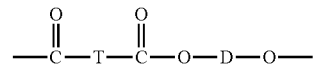

wherein D comprises an alkyl containing $C_6$-$C_{20}$ aromatic group, or a $C_6$-$C_{20}$ aromatic group, and T comprises a $C_6$-$C_{20}$ aromatic group; and/or (xxvi) the carbonate units of the polycarbonate are derived from a monomer selected from 3,3-bis(4-hydroxyphenyl)-2-phenylisoindolin-1-one (PPPBP), 1,1-bis(4-hydroxyphenyl)-1-phenyl-ethane(Bisphenol-AP), and 1,1-bis(4-hydroxyphenyl)-3,3,5-trimethyl-cyclohexane (Bisphenol-TMC), adamantyl containing aromatic dihydroxy compound, flourene containing aromatic dihydroxy compound, and combinations comprising at least one of the foregoing; and/or (xxvii) the polycarbonate further comprises carbonate units derived from 2,2-bis(4-hydroxyphenyl)propane (Bisphenol-A); and/or (xxviii) the polymer material comprises polycarbonate comprising carbonate units derived from the polysiloxane block copolymer derived from (c) the structure

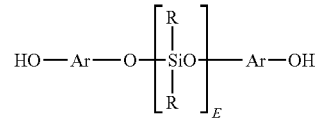

wherein R comprises a $C_1$-$C_{30}$ aliphatic, a $C_6$-$C_{30}$ aromatic group, or a combination thereof, wherein Ar comprises a $C_6$-$C_{30}$ aromatic group, or an alkyl containing a $C_6$-$C_{30}$ aromatic group, and wherein E has an average value of 20-200, or (d) the structure

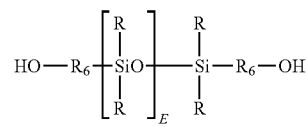

wherein R comprises a $C_1$-$C_{30}$ aliphatic, a $C_6$-$C_{30}$ aromatic group, or a combination thereof, wherein R6 comprise $C_6$-$C_{30}$ aromatic group, or a combination of a $C_6$-$C_{30}$ aromatic group and a $C_1$-$C_{30}$ aliphatic group; wherein E has an average value of 20-200; wherein the weight percent siloxane of (d) is 1-25% (specifically 8-15%); and/or (xxix) the polymer composition comprises polycarbonate further comprises carbonate units derived from BPA; and/or (xxx) the carbonate units are derived from the polysiloxane blocks having the structure

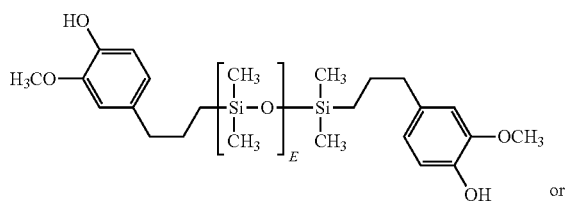

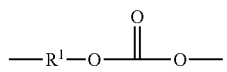

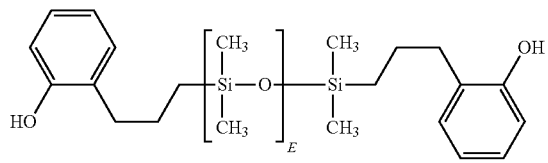

wherein E has an average value of between 20 and 200; and/or (xxxi) the carbonate units are derived from the polysiloxane blocks are derived from repeating units that are derived from dihydroxy aromatic compounds of formula:

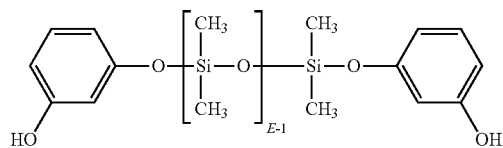

or, wherein the dihydroxy aromatic compounds have a formula:

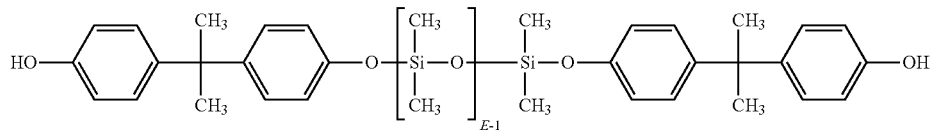

wherein E has an average value of between 20 and 200; and/or (xxxii) the polymer composition comprises polycarbonate comprising carbonate units derived from one or more polycarbonates wherein at least one of the polycarbonates is a polyesterpolycarbonate having at least one unit derived from sebacic acid and at least one unit is derived from bisphenol A; and/or (xxxiii) the sebacic acid derived polycarbonate biocontent is greater than or equal to 7% (±3%) in accordance with ASTM D6866-11, of formula and/or (xxxiv) the polymer composition comprises polycarbonate having a repeating structural background of the following formula $$—R^1—O—\overset{O}{\underset{\|}{C}}—O—$$

wherein greater than or equal to 60 percent of the total number of $R^1$ groups contain aromatic organic groups and the balance thereof are aliphatic, alicyclic, or aromatic groups, and wherein the polycarbonate comprises an end capping agent; and wherein the polycarbonate comprises a branching agent; and/or (xxxv) the polycarbonate containing the branching agent and the end-capping agent has a peak melt viscosity of greater than or equal to 8,000 poise when measured using a parallel plate melt rheology test at a heating rate of 10° C./min at a temperature of 350° C. to about 450° C.; and wherein a molded article of the composition has a UL 94 V0 rating at a thickness of 1 mm, and a flame retardant; and/or (xxxvi) the lighting element is a LED; and/or (xxxvii) the device is at least one of the following: a lamp, illumination device, lighting device for applications in the interior and exterior area, vehicle lighting, internal lighting of residential and work rooms, backlight units of LCD screens, and accent lighting; and/or (xxxviii) the polymer composition, after extrusion, has a 6 minute dwell time MVR and an 18 minute dwell time MVR, and wherein a difference between the 6 minute dwell time MVR and the 18 minute dwell time MVR is less than or equal to 30% of the 6 minute dwell time MVR; and/or (xxxix) the end-capping agent has a peak melt viscosity of greater than or equal to 7,000; and/or (xxxx) the end-capping agent has a pKa of 8.0 to 11, specifically, the end-capping agent has a pKa of 8.2 to 10.2; and/or (xxxxi) the end-capping agent is selected based upon the molecular weight of said polycarbonate and said branching level imparted by said branching agent; and/or (xxxxii) the end-capping agent comprises phenol or a phenol containing one or more substitutions comprising aliphatic groups, olefinic groups, aromatic groups, halogens, ester groups, ether groups, or halogens, or combinations comprising at least one of the foregoing thereof; and/or (xxxxiii) the end-capping agent

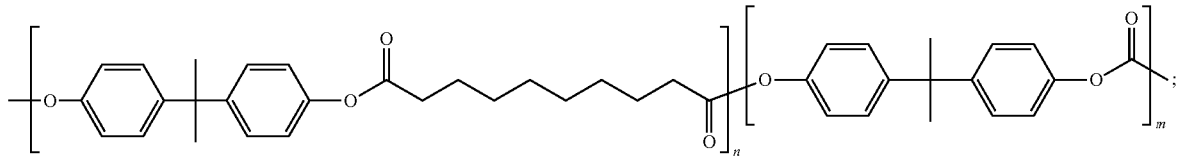

comprises phenol, p-t-butylphenol, p-cumylphenol, p-cyanophenol, and combinations thereof; and/or (xxxxiv) wherein the polycarbonate has an MVR of greater than or equal to 3 cm³/10 min; and/or (xxxxv) the polycarbonate of said composition has a branching level of greater than or equal to 1%, specifically, a branching level of greater than or equal to 2%, and more specifically, a branching level of greater than or equal to 3%; and/or (xxxxvi) the flame-retardant comprises alkali metal salts of perfluorinated $C_{1-16}$ alkyl sulfonates; potassium perfluorobutane sulfonate; potassium perfluoroctane sulfonate; tetraethylammonium perfluorohexane sulfonate; potassium diphenylsulfone sulfonate, and combinations comprising at least one of the foregoing; and/or (xxxxvii) the flame-retardant comprises a potassium perfluorobutane sulfonate salt greater than about 0.04 wt % based upon the total weight of polycarbonate resin in the composition; and/or (xxxxviii) the flame-retardant excludes a chlorine or bromine containing composition; and/or (xxxxix) the branching agent comprises THPE, TMTC, isatin-bis-phenol, and combinations comprising at least one of the foregoing; and/or (xxxxx) the polycarbonate containing said branching agent and said end-capping agent has a weight-average molecular weight of between about 20,000 g/mole to about 40,000 g/mole as measured by gel permeation chromatography using polycarbonate standards; and/or (xxxxxi) the polycarbonate is a homopolycarbonate derived from a bisphenol; and/or (xxxxxii) the polycarbonate is a copolycarbonate derived from more than one bisphenol; and/or (xxxxxiii) the polycarbonate is a copolymer derived from one or more bisphenols and containing one or more aliphatic ester units or aromatic ester units or siloxane units; and/or (xxxxxiv) the polycarbonate comprises units derived from bisphenol A; and/or (xxxxxv) a second polycarbonate, wherein said second polycarbonate comprises the formula:

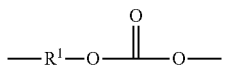

wherein said second polycarbonate is different from said polycarbonate and wherein at least 60 percent of the total number of R1 groups contain aromatic organic groups and the balance thereof are aliphatic, alicyclic, or aromatic groups; and/or (xxxxxvi) the second polycarbonate comprises units derived from bisphenol A; and/or (xxxxxvii) the composition has a haze value of less than 1.5% at 3.2 mm thickness by ASTM D1003; and/or (xxxxxviii) further comprising one or more additives; and/or (xxxxxix) wherein the additives comprise UV stabilizing additives, thermal stabilizing additives, mold release agents, colorants, organic fillers, inorganic fillers, gamma-stabilizing agents, or combinations thereof; and/or (xxxxxx) the polycarbonate containing said branching agent and said end-capping agent has a peak melt viscosity of at least 7000 poise when calculated from the equation of wherein said peak melt viscosity equals: −57135.91+36961.39*BL+14001.13*MW1/3−46944.24*pKa−322.51*BL*MW1/3−2669.19*BL*pKa+215.83*MW1/3*pKa+1125.63*BL2−200.11*MW2/3+2231.15*pKa2, wherein BL is the mole ratio of the branching agent in the formulation determined by dividing the number of moles of branching agent by the total number of moles of bisphenol or bisphenols in the composition, the MW is the weight-averaged molecular weight of said polycarbonate containing said branching agent and said end-capping agent as determined by gel permeation chromatography using polycarbonate standards, and the pKa is the pKa of the end-capping agent; and wherein a molded article of the composition has a UL94 V0 rating at a thickness of 1 mm, 1.5 mm, 2.0 mm, or between 1.0 mm and 2.0 mm; and/or (xxxxxxi) the composition has a haze value of less than 1.5% at 3.2 mm thickness by ASTM D1003; and/or (xxxxxxii) the device has a UL94 V0 rating at a thickness of 1.5 mm; and/or (xxxxxxiii) the molded article has a UL94 V0 rating at a thickness of 1.0 mm; and/or (xxxxxxiv) an additional polycarbonate, wherein said polycarbonate is linear and/or branched polycarbonate; and/or (xxxxxxv) further comprising one or more additives, wherein said additives do not have an adverse effect on a required emission profile of said device; and/or (xxxxxxvi) the lighting element is a LED; and/or (xxxxxxvii) the device is at least one of the following: a lamp, illumination device, lighting device for applications in the interior and exterior area, vehicle lighting, internal lighting of residential and work rooms, backlight units of LCD screens, and accent lighting; (xxxxxxviii) a light emitting element; and/or (xxxxxxix) the coated conversion material is a rare earth doped yttrium aluminum garnet, rare earth doped nitridosilicate, rare earth doped sulfate, or combination comprising at least one of the foregoing.

A molded article containing a composition comprising at least a polycarbonate and a coated conversion material has a UL 94 V0 rating at a thickness of 2.0 mm, specifically at 1.5 mm, and more specifically, at 1 mm.

A molded article containing a composition comprising at least a polycarbonate and a coated conversion material can have: (i) an impact of 850 joules/meter (J/m), Notched izod impact at 23° C. and 0.125 inches per ASTM D256-10; and/or (ii) a glass transition temperature of 145° C. to 155° C. (e.g., about 148 to about 149° C.); and/or (iii) an MVR of less than 7 cubic centimeters per 10 minutes (cm³/10 min), specifically, 6.5 cm³/10 min, at a temperature of 300° C. at load of 1.2 kgf (kilogram foot) a thickness of 2.54 centimeters and a time of 6 minutes; and/or (iv) an MVR of 7.15 cm³/10 min at a temperature of 300° C. at load of 1.2 kgf (kilogram foot) a thickness of 2.54 centimeters and a time of 18 minutes; and/or (v) a transmission of 30% to 60% (specifically, 48%) at 0.041 inches (1.04 millimeters) thickness.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. A light emitting device, comprising:
  a lighting element located in a housing, wherein the housing is formed from a polymer composition comprising:
    a polymer material comprising polycarbonate; and
    a coated conversion material comprising coated yttrium aluminum garnet (YAG) doped with rare earth elements, coated terbium aluminum garnet doped with rare earth elements, coated silicate (BOSE) doped with rare earth elements; coated nitrido silicates doped with rare earth elements; coated nitride orthosilicate doped with rare earth elements, coated oxonitridoaluminosilicates doped with rare earth elements; and combinations comprising at least one of the foregoing;

wherein the coated conversion material has a coating comprising at least one of a silicone oil and amorphous silica; and wherein after the coated conversion material has been exposed to an excitation source, the coated conversion material has a luminescence lifetime of less than $10^{-4}$ seconds when the excitation source is removed.

2. The device of claim 1, wherein the coated conversion material is coated with 0.05 wt % to 20 wt % silicone oil based upon the weight of the coated conversion material.

3. The device of claim 1, wherein the polymer composition comprises 0.1 to 40 pbw of the coated conversion material based on 100 pbw of polymer material.

4. The device of claim 1, wherein the polymer composition comprises 4 to 20 pbw of the coated conversion material based on 100 pbw of polymer material.

5. The device of claim 1, wherein the polymer composition has a 6 min MVR that is less than or equal to 30% greater than a polymer material 6 min MVR.

6. The device of claim 1, wherein the polymer composition, after extrusion, has a 6 minute dwell time MVR and an 18 minute dwell time MVR, and wherein a difference between the 6 minute dwell time MVR and the 18 minute dwell time MVR is less than or equal to 30% of the 6 minute dwell time MVR.

7. The device of claim 6, wherein the polymer composition has a 6 min MVR that is less than or equal to 5% greater than a polymer material 6 min MVR.

8. The device of claim 1, wherein the polymer composition further comprises greater than 0 to 1 pbw particles, based upon 100 pbw of polymer material, wherein the particles are selected from at least one of the following scattering particles, interference particles, and color absorbing particles.

9. The device of claim 1, wherein the polymer composition comprises 0.001 pbw to 0.3 pbw scattering particles, based upon 100 pbw of polymer material.

10. The device of claim 1, wherein the coated conversion material comprises a luminescent material having the formula:

$(A^3)_2SiO_4:EU^{2+}D^1$ wherein $A^3$ is a divalent metal selected from at least one of the following Sr, Ca, Ba, Mg, Zn, Cd, and combinations comprising at least one of the foregoing; and $D^1$ is a dopant selected from at least one of the following F, Cl, Br, I, P, S and N and combinations comprising at least one of the foregoing.

11. The device of claim 1, wherein the coated conversion material comprises a luminescent material having formula:

$(YA^5)_3(AlB^1)_5(OD^3)_{12}:Ce^{3+}$ where $A^5$ is a trivalent metal selected from at least one of the following Gd, Tb, La, Sm, luminescence, or a divalent metal ion selected from Sr, Ca, Ba, Mg, Zn and Cd, and combinations comprising at least one of the foregoing; $B^1$ is selected from at least one of the following Si, B, P, and Ga, and combinations comprising at least one of the foregoing; and $D^3$ is a dopant selected from F, Cl, Br, I, P, S, and N, and combinations comprising at least one of the foregoing.

12. The device of claim 1, wherein the coated conversion material comprises an orange-red silicate-based conversion material having formula:

$(SrM1)_3Si(OD^4)_5:Eu$ wherein M1 is selected from at least one of the following Ba, Ca, Mg, Zn, and combinations comprising at least one of the foregoing; and $D^4$ is selected from F, Cl, S, N, and combinations comprising at least one of the foregoing.

13. The device of claim 1, wherein the coated conversion material comprises a rare earth doped red silicon nitride based conversion material having a formula:

$(SrM2)_2Si_5N_8$ wherein M2 is selected from at least one of the following Sr, Ca, Mg, Zn, and combinations comprising at least one of the foregoing.

14. The device of claim 1, wherein the coated conversion material comprises a silicone oil coating.

15. The device of claim 14, wherein the silicone oil is selected from at least one of the following hydrogen-alkyl siloxane oil; polydialkyl siloxance oil; polydimethyl siloxane codiphenyl siloxane, dihydroxy terminated, and combinations comprising at least one of the foregoing.

16. The device of claim 1, wherein the coated conversion material comprises an amorphous silica coating.

17. The device of claim 1, wherein the polymer material is selected from at least one of the following a polycarbonate, polyethylene terephthalate, polybutylene terephthalate, polymethyl methacrylate, polyamide, and combinations comprising at least one of the foregoing.

18. The polymer composition of claim 1, wherein the polymer material comprises polycarbonate having a repeating structural background of the following formula

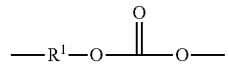

wherein greater than or equal to 60 percent of the total number of $R_1$ groups contain aromatic organic groups and the balance thereof are aliphatic, alicyclic, or aromatic groups.

19. The device of claim 1, wherein the polymer material comprises polycarbonate having a glass transition temperature of greater than 170° C. as measured using a differential scanning calorimetry method, wherein the polycarbonate is derived from:

(i) a monomer having the structure

HO-$A_1$-$Y_1$-$A_2$-OH wherein each of $A_1$ and $A_2$ comprise a monocyclic divalent arylene group, and $Y_1$ is a bridging group; or (ii) polyester monomer units having the structure

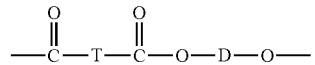

wherein D comprises an alkyl containing $C_6$-$C_{20}$ aromatic group, or a $C_6$-$C_{20}$ aromatic group, and T comprises a $C_6$-$C_{20}$ aromatic group.

20. The polymer composition of claim 19, wherein carbonate units of the polycarbonate are derived from a monomer selected from 3,3-bis(4-hydroxyphenyl)-2-phenylisoindolin-1-one (PPPBP), 1,1-bis(4-hydroxyphenyl)-1-phenylethane(Bisphenol-AP), and 1,1-bis(4-hydroxyphenyl)-3,3,5-trimethyl-cyclohexane (Bisphenol-TMC), adamantyl containing aromatic dihydroxy compound, flourene containing aromatic dihydroxy compound, 3,3-bis(4-hydroxyphenyl)-2-methylisoindolin-1-one, and combinations comprising at least one of the foregoing.

21. The device of claim 19, wherein the polycarbonate further comprises carbonate units derived from 2,2-bis(4-hydroxyphenyl)propane (Bisphenol-A).

22. The device of claim 1, wherein the polymer material comprises polycarbonate comprising carbonate units derived from the polysiloxane block copolymer derived from (iii) the structure

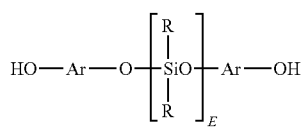

wherein R comprises a $C_1$-$C_{30}$ aliphatic, a $C_6$-$C_{30}$ aromatic group, or a combination thereof, wherein Ar comprises a $C_6$-$C_{30}$ aromatic group, or an alkyl containing a $C_6$-$C_{30}$ aromatic group, and wherein E has an average value of 20-200, or (iv) the structure

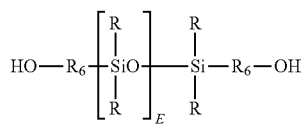

wherein R comprises a $C_1$-$C_{30}$ aliphatic, a $C_6$-$C_{30}$ aromatic group, or a combination thereof, wherein $R_6$ comprise $C_6$-$C_{30}$ aromatic group, or a combination of a $C_6$-$C_{30}$ aromatic group and a $C_1$-$C_{30}$ aliphatic group; wherein E has an average value of 20-200;

wherein the weight % siloxane of (iv) is 1-25%.

23. The device of claim 22, wherein the weight % siloxane of (iv) is 8-15%.

24. The device of claim 22, wherein the polymer composition comprises polycarbonate further comprises carbonate units derived from 2,2-bis(4-hydroxyphenyl)propane.

25. The device of claim 22, wherein the carbonate units are derived from the polysiloxane blocks having the structure

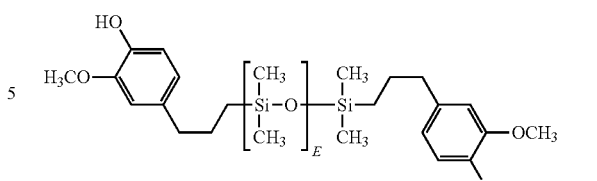

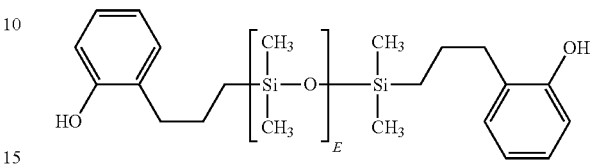

wherein E has an average value of between 20 and 200.

26. The device of claim 22, wherein the carbonate units are derived from the polysiloxane blocks are derived from repeating units that are derived from dihydroxy aromatic compounds of formula:

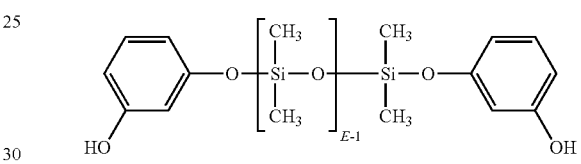

or, wherein the dihydroxy aromatic compounds have a formula:

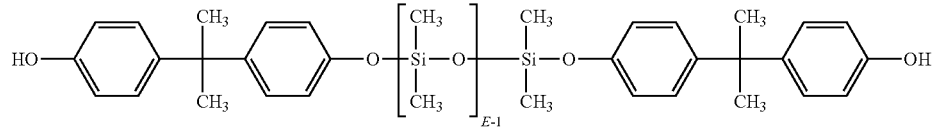

wherein E has an average value of between 20 and 200.

27. The device of claim 1, wherein the polymer composition comprises polycarbonate comprising carbonate units derived from one or more polycarbonates wherein at least one of the polycarbonates is a polyesterpolycarbonate having at least one unit derived from sebacic acid and at least one unit is derived from an aromatic dihydroxy carbonate or 2,2-bis(4-hydroxyphenyl)propane; formula

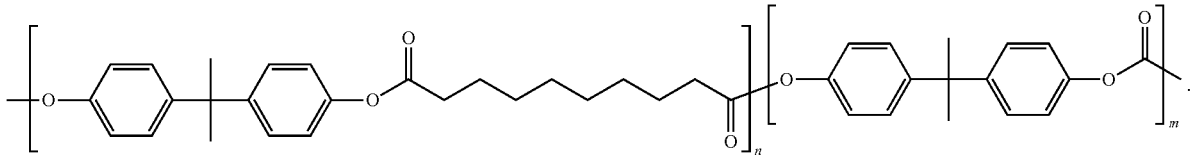

28. The device of claim 27, wherein the sebacic acid derived polycarbonate biocontent is greater than or equal to 7% (±3%) in accordance with ASTM D6866-11.

29. The device of claim 1, wherein the polymer composition comprises polycarbonate having a repeating structural background of the following formula

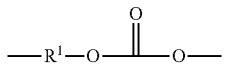

wherein greater than or equal to 60 percent of the total number of $R_1$ groups contain aromatic organic groups and the balance thereof are aliphatic, alicyclic, or aromatic groups;

wherein the polycarbonate comprises an end capping agent; and wherein the polycarbonate comprises a branching agent.

30. The device of claim 29, wherein the polycarbonate containing the branching agent and the end-capping agent has a peak melt viscosity of greater than or equal to 8,000 poise when measured using a parallel plate melt rheology test at a heating rate of 10° C./min at a temperature of 350° C. to about 450° C.; and wherein a molded article of the composition has a UL 94 V0 rating at a thickness of 1 mm, and a flame retardant.

31. The device of claim 29, wherein the end-capping agent has a peak melt viscosity of greater than or equal to 7,000.

32. The device of claim 29, wherein the end-capping agent has a pKa of 8.0 to 11.

33. The device of claim 29, wherein the end-capping agent has a pKa of 8.2 to 10.2.

34. The device of claim 29, wherein the end-capping agent is selected based upon the molecular weight of said polycarbonate and said branching level imparted by said branching agent.

35. The device of claim 29, wherein the end-capping agent comprises phenol or a phenol containing one or more substitutions comprising aliphatic groups, olefinic groups, aromatic groups, halogens, ester groups, ether groups, or halogens, or combinations thereof.

36. The device of claim 29, wherein the end-capping agent comprises phenol, p-t-butylphenol, p-cumylphenol, p-cyanophenol, and combinations thereof.

37. The device of claim 29, wherein the polycarbonate has an MVR of greater than or equal to 3 cm$^3$/10 min.

38. The device of claim 29, wherein the polycarbonate of said composition has a branching level of greater than or equal to 1%.

39. The device of claim 29, wherein the polycarbonate of said composition has a branching level of greater than or equal to 2%.

40. The device of claim 29, wherein the polycarbonate of said composition has a branching level of greater than or equal to 3%.

41. The device of claim 29, wherein the flame-retardant comprises alkali metal salts of perfluorinated $C_{1-16}$ alkyl sulfonates; potassium perfluorobutane sulfonate; potassium perfluoroctane sulfonate; tetraethylammonium perfluorohexane sulfonate; potassium diphenylsulfone sulfonate, and combinations comprising at least one of the foregoing.

42. The device of claim 29, wherein the flame-retardant comprises a potassium perfluorobutane sulfonate salt greater than about 0.04 wt % based upon the total weight of polycarbonate resin in the composition.

43. The device of claim 29, wherein the flame-retardant excludes a chlorine or bromine containing composition.

44. The device of claim 29, wherein the branching agent comprises THPE, TMTC, isatin-bis-phenol, and combinations comprising at least one of the foregoing.

45. The device of claim 29, wherein the polycarbonate containing said branching agent and said end-capping agent has a weight-average molecular weight of between about 20,000 g/mole to about 40,000 g/mole as measured by gel permeation chromatography using polycarbonate standards.

46. The device of claim 29, wherein the polycarbonate is a homopolycarbonate derived from a bisphenol.

47. The device of claim 46, wherein the polycarbonate is a copolycarbonate derived from more than one bisphenol.

48. The device of claim 47, wherein the polycarbonate is a copolymer derived from one or more bisphenols and containing one or more aliphatic ester units or aromatic ester units or siloxane units.

49. The device of claim 46, wherein the polycarbonate comprises units derived from bisphenol A.

50. The device of claim 29, further comprising a second polycarbonate, wherein said second polycarbonate comprises the formula:

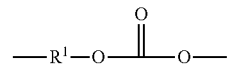

wherein said second polycarbonate is different from said polycarbonate and wherein at least 60 percent of the total number of $R^1$ groups contain aromatic organic groups and the balance thereof are aliphatic, alicyclic, or aromatic groups.

51. The device of claim 50, wherein the second polycarbonate comprises units derived from bisphenol A.

52. The device of claim 29, wherein the composition has a haze value of less than 1.5% at 3.2 mm thickness by ASTM D1003.

53. The device of claim 29, further comprising one or more additives.

54. The device of claim 29, wherein the additives comprise UV stabilizing additives, thermal stabilizing additives, mold release agents, colorants, organic fillers, inorganic fillers, gamma-stabilizing agents, or combinations thereof.

55. The device of claim 29, wherein the polycarbonate containing said branching agent and said end-capping agent has a peak melt viscosity of at least 7000 poise when calculated from the equation of wherein said peak melt viscosity equals: $-57135.91+36961.39*BL+14001.13*MW^{1/3}-46944.24*pKa-322.51*BL*MW^{1/3}-2669.19*BL*pKa+215.83*MW^{1/3}*pKa+1125.63*BL^2-200.11*MW^{2/3}+2231.15*pKa^2$, wherein BL is the mole ratio of the branching agent in the formulation determined by dividing the number of moles of branching agent by the total number of moles of bisphenol or bisphenols in the composition, the MW is the weight-averaged molecular weight of said polycarbonate containing said branching agent and said end-capping agent as determined by gel permeation chromatography using polycarbonate standards, and the pKa is the pKa of the end-capping agent; and wherein a molded article of the composition has a UL94 V0 rating at a thickness of 1 mm, 1.5 mm, 2.0 mm, or between 1.0 mm and 2.0 mm.

56. The device of claim 29, wherein the composition has a haze value of less than 1.5% at 3.2 mm thickness by ASTM D1003.

57. The device of claim 29, wherein the device has a UL94 V0 rating at a thickness of 1.5 mm.

58. The device of claim 29, wherein the molded article has a UL94 V0 rating at a thickness of 1.0 mm.

59. The device of claim 1, further comprising an additional polycarbonate, wherein said polycarbonate is linear and/or branched polycarbonate.

60. The device of claim 1, further comprising one or more additives, wherein said additives do not have an adverse effect on a required emission profile of said device.

61. The device according to claim 1, wherein the lighting element is a LED.

62. The device according to claim 1, wherein the device is at least one of the following: a lamp, illumination device, lighting device for applications in the interior and exterior area, vehicle lighting, internal lighting of residential and work rooms, backlight units of LCD screens, and accent lighting.

63. A light-emitting device, comprising:
a means for emitting radiation having a first wavelength range, wherein the means for emitting radiation is located in a housing, wherein the housing is formed from a polymer composition comprising:
a polymer material; and
means for absorbing at least a portion of the first wavelength range radiation and emitting radiation having a second wavelength range;
wherein after the means for absorbing has been exposed to the radiation, the means for absorbing has a luminescence lifetime of less than $10^{-4}$ seconds when the radiation exposure stops;
wherein the means for absorbing comprises
greater than 0 ppm of a first material selected from at least one of the following Si, Sr, Ba, Ca, Eu, and combinations comprising at least one of the foregoing first materials; and
less than 50 ppm of a second material selected from at least one of the following Al, Co, Fe, Mg, Mo, Na, Ni, Pd, P, Rh, Sb, Ti, Zr, and combinations comprising at least one of the foregoing second materials.

64. A lighting device, comprising:
a radiation source configured to emit radiation having a first wavelength range;
an optical component comprising a polymer composition comprising:
a polymer material; and
a coated conversion material, wherein the coated conversion material comprises
greater than 0 ppm of a first material selected from Si, Sr, Ba, Ca, Eu, and combinations comprising at least one of the foregoing first materials; and
less than 50 ppm of a second material selected from Al, Co, Fe, Mg, Mo, Na, Ni, Pd, P, Rh, Sb, Ti, Zr, and combinations comprising at least one of the foregoing second materials;
wherein the coated conversion material is a conversion material having a surface with a coating on the surface
wherein after the coated conversion material has been exposed to an excitation source, the coated conversion material has a luminescence lifetime of less than $10^{-4}$ seconds when the excitation source is removed.

65. A lighting device, comprising:
a radiation source configured to emit radiation having a first wavelength range;
an optical component comprising a polymer composition comprising:
a polymer material; and
a coated conversion material comprising at least one of coated yttrium aluminum garnet (YAG) doped with rare earth elements, coated terbium aluminum garnet doped with rare earth elements; coated nitrido silicates doped with rare earth elements; coated nitride orthosilicate doped with rare earth elements, coated oxonitridoaluminosilicates doped with rare earth elements; and combinations comprising at least one of the foregoing;
wherein the coated conversion material has a coating comprising at least one of a silicone oil and amorphous silica; and
wherein after the coated conversion material has been exposed to an excitation source, the coated conversion material has a luminescence lifetime of less than $10^{-4}$ seconds when the excitation source is removed.

66. The device of claim 64, wherein the coating is chemically interacted with the surface.

67. The device according to claim 65, wherein the device is at least one of the following: a lamp, illumination device, lighting device for applications in the interior and exterior area, vehicle lighting, internal lighting of residential and work rooms, backlight units of LCD screens, and accent lighting.

68. The device of claim 65, wherein the device is a backlight unit of a LCD screen.

69. The device of claim 62, wherein the device is a backlight unit of a LCD screen.

* * * * *